US009274203B1

(12) United States Patent
Yap et al.

(10) Patent No.: US 9,274,203 B1
(45) Date of Patent: Mar. 1, 2016

(54) CENTROID LOCATING SENSORS HAVING PLURAL SPATIAL FILTERING LOGIC CIRCUITS CONNECTED TO PLURAL DIGITIZATION COMPARATORS AND METHODS FOR LOCATING AN ILLUMINATED SPOT ON A DETECTOR

(71) Applicant: The Boeing Company, Chicago, IL (US)

(72) Inventors: Daniel Yap, Newbury Park, CA (US); Randall White, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 255 days.

(21) Appl. No.: 14/104,593

(22) Filed: Dec. 12, 2013

(51) Int. Cl.
*G01S 3/783* (2006.01)
*H03K 23/78* (2006.01)

(52) U.S. Cl.
CPC .............. *G01S 3/783* (2013.01); *H03K 23/78* (2013.01)

(58) Field of Classification Search
CPC ....... F41G 7/2253; F41G 7/226; F41G 7/008; F41G 7/2226
USPC ......... 250/203.1, 203.2, 203.6, 214.1, 214 R, 250/221; 356/5.06–5.08, 139.01–139.7; 244/3.11–3.17
See application file for complete search history.

(56) References Cited

U.S. PATENT DOCUMENTS 5,175,694 A * 12/1992 Amato ............... F41G 7/2226 348/169
7,842,908 B2 11/2010 Andresson

OTHER PUBLICATIONS

"Pacific Silicon Sensor QuadrantSeries Data Sheet Part Description QP100-6-SM," (Sep. 24, 2010).
"Pacific Silicon Sensor Series 6 Data Sheet Quad Sum and Difference Amplifier Part Description QP50-6SD2-DIAG," (Sep. 24, 2010).
"OSI Optoelectronics FCI-InGaAs-QXXX Large Active Area InGaAs Quadrants".
A. Makynen and J. Kostamovaara, Linear and sensitive CMOS position-sensitive photodetector, Electronics Letters, vol. 34, pp. 1255-1256 (1998).
P. F. I. Scott, A. S. Kachatkou, N. R. Kyele and R. G. van Silfhout, "Real-time photon beam localization methods using high-resolution imagers and parallel processing using a reconfigurable system," Optical Engineering, vol. 48, p. 073601 (2009).

(Continued)

*Primary Examiner* — Que T Le
(74) *Attorney, Agent, or Firm* — Joseph M. Butscher; The Small Patent Law Group, LLC

(57) ABSTRACT

Centroid locating sensors and methods for locating an illuminated spot on a detector are provided. One sensor includes a plurality of photo-diode (PD) detector elements connected to the PD detector elements. The sensor also includes a plurality of digitization comparators connected to the plurality of PD detector elements and configured to receive output signals from the plurality of PD detector elements and generate a binary 1 output when the output from the PD detector element exceeds a threshold set point and generate a binary 0 output when the output is below the threshold set point. The sensor further includes a plurality of spatial filtering logic circuits connected to the digitization comparators and are configured to receive outputs from a plurality of the PD detector elements and to reject noise for one of the PD detector elements.

35 Claims, 12 Drawing Sheets

(56) References Cited

OTHER PUBLICATIONS

A. Makynen, T. Rahkonen and J. Kostamovaara, "A binary photodetector array for position sensing," Sensors and Actuators A, vol. 65, pp. 45-53 (1998).

A. Makynen, T. Rahkonen and J. Kostamovaara, "Digital optical position-sensitive detector (PSD)," Proceedings 21~1 IEEE Instrumentation and Measurement Technology Conference (IMTC04), vol. 3, pp. 2358-2360 (2004).

C. B. Bose and L Amir, "Design of ftducials for accurate registration using machine vision," IEEE Transactions on Pattern Analysis and Machine Intelligence, vol. 13, pp. 1196-1 200 (1990).

C. Sklair, W. Hoff and L. Gatrell, "Accuracy of locating circular features using machine vision," Proceedings SPIE vol. 1612, pp. 222-234 (1991).

M. R. Shortis, T. A. Clarke and T. Short, "A comparison of some techniques for the subpixel location of discrete target images," Proceedings SPIE vol. 2350, pp. 239-250 (1994).

J. A. Cox, "Point source location sensitivity analysis," Proceedings SPIE vol. 686, pp. 130-137 (1986).

* cited by examiner

CENTROID LOCATING SENSORS HAVING PLURAL SPATIAL FILTERING LOGIC CIRCUITS CONNECTED TO PLURAL DIGITIZATION COMPARATORS AND METHODS FOR LOCATING AN ILLUMINATED SPOT ON A DETECTOR

BACKGROUND

The present disclosure relates generally to optical sensors, and more particularly, to optical seekers, such as used for guiding a steerable rocket or other projectile.

In a projectile application, optical seekers are typically located at the nose or tip of the projectile, such as in a laser-guided projectile. Conventional laser-guided projectiles typically have a silicon quadrant detector forming an illuminated-spot locating detector (ISLD). This quadrant detector has four light-detecting elements, generally of equal size, that have silicon light-absorbing regions and is often referred to as a 4-quadrant detector. In this conventional 4-quadrant detector, the output currents from the four elements are processed in an analog manner to obtain the location of the centroid for the spot of light.

Conventional 4-quadrant detectors that are typically fabricated in silicon have strong absorption for light of wavelengths between 0.48 and 1.06 µm. In order to sense eye-safe wavelengths, 4-quadrant detectors have been made that use InGaAs light-absorbing material. However the InGaAs detectors have a fairly high capacitance (e.g., $1.3 \times 10^{-4}$ pF/µm$^2$).

To achieve angle of arrival (AOA) sensing with a large angular field of view while using a lens with a reasonable F-number (e.g., F/1 and larger), it is desirable for the overall active-area of the detector to be larger than 15 mm on a side and, in some cases, larger than 25-30 mm on a side. Also, it is desirable to achieve that large active area while providing a pulse-response rise time that is a factor of 5 to 10 shorter than that provided by the conventional 4-quadrant detectors.

One approach to keeping the large overall active detector area from limiting the response speed or measurement bandwidth is to use an array of photodiode (PD) elements. This PD array groups the elements into sets that occupy four quadrants of the array such that the outputs from the elements in each quadrant are summed together, with the summed signal being output from the array. Prior to being summed, the photocurrent signal from each PD element is amplified and then is passed through a thresholding circuit that blocks or eliminates the inputs having a magnitude below a threshold value. This thresholding prevents the summed noise output obtained when no pulse of light is illuminating the array from being falsely interpreted as additional pulses. However, this thresholding circuit is not able to reduce the noise that is added to the magnitude of the photocurrent pulse when such a pulse is present. In addition to the summed signal for the four quadrants, this known array provides the outputs of the individual array elements in a serially multiplexed fashion, on a frame by frame basis. Thus, the output rate for the signals from individual array elements is quite slow (<<100 kHz).

In some systems, additional post-processing circuitry is included to track the moving location of the spot of light. Such systems combine the location-determination linearity of an array having many elements with the sub-spot interpolation achieved with the inherently non-linear, but high spatial-resolution 4-quadrant approach. Also, instead of using a PD array as an effective 4-quadrant detector, the outputs from the array elements also may be used to compute the centroid (or the center of gravity, or the moment) of the illuminating spot.

Such centroid determination typically is performed using an image processing computer or a field-programmable gate array (FPGA). The error in determining the location of the center of the spot is reduced as the illuminated spot is made wider. However, the numerous analog arithmetic operations of multiplying, summing, and dividing involved in calculating the centroid requires substantial signal processing resources for a sensor that needs to determine the centroid location in real time.

In some systems, signal processing load may be reduced by using an array of binary detectors. However, this array is intended for frame-by-frame readout. Moreover, the input to the thresholding circuit includes the contributions of both the photo-generated current and the noise currents.

Thus, PD arrays have been provided with a binary output to achieve a compact AOA sensor that has wide field of view. However, in order to reduce the location-estimation error of the associated binary centroid determination method, the number of elements in the array that are illuminated concurrently by a given spot of light has to be increased. As a result, the higher accuracy binary centroid location requires the illuminating light to be quite intense, so that the corresponding energy can be spread over many PD elements of the array and still have the signal-to-noise ratio for each array element be sufficiently high.

Thus, it is desirable to provide a centroid-locating AOA sensor that can provide high-resolution and high-accuracy estimation of the incidence angle of a beam of light collected by the aperture of the sensor even for lower levels of the intensity of that light. Moreover, the conventional systems do not provide a high-linearity, centroid-locating PD-array AOA sensor that can process the outputs of the PD elements directly, in a manner similar to that of the 4-quadrant detectors, and that does not require the signals from the PD array elements to first be read out in a serially-multiplexed, frame-by-frame manner before the determination of the centroid location is performed.

Moreover, while it is desirable to enlarge the size of the illuminated spot on a binary PD array in order to improve the centroid location accuracy, the higher sensitivity for incident light of weaker intensity is obtained by spreading that incident light over the smaller area of a smaller illuminated spot on the PD array. Thus, there is a trade-off between achieving high centroid-location accuracy and high sensitivity.

SUMMARY

In accordance with an embodiment, a centroid-locating sensor is provided that includes a plurality of photo-diode (PD) detector elements connected to the PD detector elements. The sensor also includes a plurality of digitization comparators connected to the plurality of PD detector elements and configured to receive output signals from the plurality of PD detector elements and generate a binary 1 output when the output from the PD detector element exceeds a threshold set point and generate a binary 0 output when the output is below the threshold set point. The sensor further includes a plurality of spatial filtering logic circuits connected to the digitization comparators and are configured to receive outputs from a plurality of the PD detector elements and to reject noise for one of the PD detector elements.

In accordance with another embodiment, an angle-of-arrival determining sensor is provided that includes a plurality of photo-diode (PD) detector elements arranged in an array and a plurality of digitization comparators coupled to outputs of the plurality of the PD detector elements. The digitization comparators are configured to generate a binary 1 output when an output from a preamplifier for a PD detector element of the plurality of PD detector elements exceeds a threshold set point and generate a binary 0 output when the output from the PD detector element is below the threshold set point. The angle-of-arrival determining sensor also includes an optical system configured to project a spot of light onto at least some of the PD detector elements, with the spot of light having a lateral dimension that is between two times and ten times as large as a lateral dimension of a PD element of plurality of PD elements.

DETAILED DESCRIPTION

Figure 1:
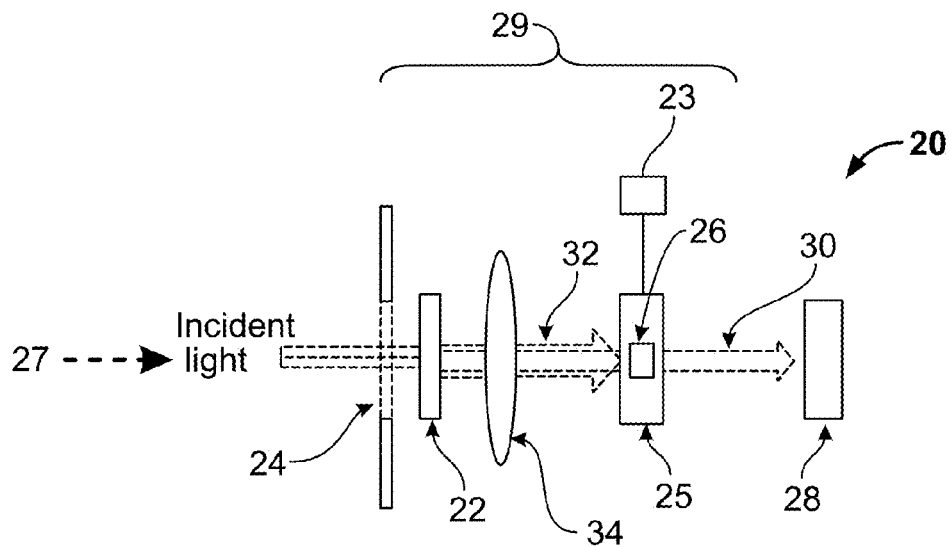
FIG. 1 is a schematic illustration of an optical sensor in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, filters, memories or circuits) may be implemented in a single piece of hardware (e.g., a general purpose signal processor or random access memory, field programmable gate array, custom-designed logic circuit, or the like) or multiple pieces of hardware. Similarly, the programs may be stand-alone programs, may be incorporated as subroutines in an operating system, may be functions in an installed software package, and the like. It should be understood that the various embodiments are not limited to the arrangements and instrumentality shown in the drawings. as As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Also as used herein, the phrase "image" or similar terminology is not intended to exclude embodiments in which data representing an image is generated, but a viewable image is not. Therefore, as used herein the term "image" broadly refers to both viewable images and data representing a viewable image. However, certain embodiments generate, or are configured to generate, at least one viewable image.

Various embodiments provide systems and methods for optical detection, such as for an optical sensor (or optical seeker) to allow centroid-location determination. In some embodiments, a sensor with an array of photodiode (PD) detectors is provided having outputs that are coupled to an array of electronic preamplifiers and noise-bandwidth limiting filters, as well as to a centroid location determining logic circuit (or centroid-location module). Using a spatial filtering function in the centroid-location module in various embodiments reduces or eliminates the noise associated with the non-illuminated regions of the PD array. By practicing various embodiments, a reasonably high centroid-location accuracy is provided by using an illuminated spot having a diameter (or lateral dimension) that covers the summed lateral dimension of, for example, only 2.5 to 5 array elements (instead of twenty or more that would otherwise be used). Thus, the optical power in each illuminated pixel can be much higher. Also, use of the spatial filtering function allows for a reduction in the threshold set-point for a digitization comparator while still rejecting the "dark element" noise, thereby enabling the sensor to sense and accurately locate spots of light that have lower intensity.

As described in more detail herein, in some embodiments, each array element is further coupled to a digitizing comparator that produces a binary 1 output when the filtered output from the preamplifier for that array element exceeds a threshold set point and produces a binary 0 output when the filtered output from the preamplifier is below the threshold set point. This sensor arrangement determines the centroid of a spot of light that illuminates a portion of the PD array. The sensor also includes an optical system (having an entrance aperture, a lens and an optional diffuser in some embodiments) that projects a spot of light onto the PD array, with that spot having a lateral dimension (e.g., diameter for a circular spot) that is between two times and ten times as large as the lateral dimension of a PD element of the array, which in one embodiment is between 2.5 times and 5 times as large as the lateral dimension of the PD element.

The sensor also includes a set of spatial filtering logic circuits or module, with each spatial filtering logic circuit or module operating on the outputs from a group of several PD elements to reject noise contributions associated with individual PD elements with binary 1 output having, for example, immediately surrounding or adjacent PD elements with binary 0 outputs, which indicates that the PD elements are not illuminated by the spot of projected light. It should be noted that different spatial filtering circuits are associated with different groups of PD elements. However, some of the different groups of PD elements can have some PD elements in common. In some embodiments, the spatial filters consider all of the nearest neighbor elements (e.g., all adjacent PD elements), and in other embodiments, the spatial filters consider only some of the nearest neighbor elements.

In operation, updates of the determined location values can be made at a Nyquist clock rate that is two times the measurement bandwidth set by the noise-bandwidth limiting filter. In some embodiments, the latency of the signal paths for the various array elements, the latency of the signal paths in the spatial filtering circuits for various groups of array elements, and the latency of the signal paths in the centroid-locating circuits for the two axes of the array are matched to enable the values in the multiple bits of the two binary outputs representing the X-location and the Y-location of the centroid to indicate the same instance in time for the location of the illuminating spot.

The PD can also have an absorber layer comprising a direct-bandgap semiconductor material such as GaAs, InGaAs, InAsSb, InAs, InSb and HgCdTe. The PD also can include an avalanche carrier-multiplication structure as described herein.

More particularly, FIG. 1 illustrates an optical sensor 20 that can determine the angle of arrival (AOA) of incident light. The optical sensor 20 in the illustrated embodiment includes a wavelength-selective optical diffuser 22 that operates without or with reduced blurring of the optical image formed on the detector. In the illustrated embodiment, the wavelength-selective diffuser 22 is positioned at or adjacent at an optical aperture 24 (such as an entrance aperture), for example, across an optical light path 27 (illustrated as incident light entering the optical aperture 24). For example, the wavelength-selective diffuser 22 is positioned a distance from the optical aperture 24 such that light entering through the optical aperture 24 (from left to right as viewed in FIG. 1) first passes through the wavelength-selective diffuser 22 before reaching the other components of the optical sensor 20. The wavelength-selective diffuser 22 is, thus, positioned in front of the other components of the optical sensor 20 along a direction of travel of incident light. However, it should be noted that the positioning of the wavelength-selective diffuser 22 may be varied, such as positioned along the optical light path 27, for example between different components of the optical sensor 20. In some embodiments, the wavelength-selective diffuser 22 may be provided as described in co-pending application Ser. No. 14/030,485, entitled "Wavelength Selective Optical Diffuser", which is incorporated by reference herein in its entirety.

In the illustrated embodiment, the optical sensor 20 generally includes a laser light detecting element (capable of detecting light at one or more wavelengths, such as laser wavelengths), illustrated as semi-active laser (SAL) detector module 25, which may include an illuminated-spot locating detector (ISLD) 26 and associated electronics as described herein. The ISLD 26 is positioned a distance along the optical light path 27 in-line with the wavelength-selective diffuser 22, for example, such that a common optical path is defined or shared between the components. The optical sensor 20 also includes an imaging detector (capable of detecting light at a different wavelength or wavelengths than light detected by the ISLD 26), illustrated as a focal plane array (FPA) imaging detector module 28, which may include associated electronics as described herein.

Thus, in the illustrated embodiment, the optical sensor 20 has an in-line optical configuration defining a common optical axis. In operation, the optical aperture 24 (which may be sized and shaped based on, for example, the application or use of the optical sensor 20) is configured to collect light of a first wavelength range (e.g., long-wave infrared (LWIR) range of 8-12 µm), as well as laser light at multiple wavelengths in a second wavelength range (e.g., 1.0 µm-1.65 µm). In some embodiments, the shortest wavelength of the first range is at least 5 times larger than the longest wavelength of the second range. However, as should be appreciated, detection at different wavelengths and relative ranges may be provided.

In various embodiments, the FPA imaging detector 28 is capable of detecting light 30 of a first wavelength range (e.g., LWIR light) and the ISLD 26 includes multiple elements that are capable of detecting light 32 of the entire second wavelength range (e.g. laser light). In the illustrated embodiment, the ISLD 26 is configured to have a high transparency to light of the first wavelength range, for example, such that all or substantially all of the light 30 passes through the ISLD 26 to the FPA imaging detector 28 (e.g., 20% or less absorption), while all or substantially all of the light 32 is absorbed and detected by the ISLD 26 (e.g., greater than 90%).

Additionally, the wavelength-selective optical diffuser 22 is configured to diffuse or spread the light 32 (e.g., laser light of the second wavelength range), but minimally diffuse or spread the light 30 of the first wavelength range (e.g., less than 10% from a projected path). It should be noted that the optical sensor 20 also includes an optical imaging system 34, such as a lens or compound lens, that projects and focuses the light 30 (of the first wavelength range) onto the FPA imaging detector 28 and that, in combination with the wavelength-selective optical diffuser 22, projects onto the ISLD 26 an illuminated spot that simultaneously or concurrently overlaps a plurality of light-detecting elements of the ISLD 26 (e.g., more than four light-detecting elements of the ISLD 26), which comprises an array of light-detecting elements (e.g., at least 20 light-detecting elements).

It should be noted that the FPA imaging detector 28 is generally coupled to one or more associated readout integrated circuits, with both being part of or forming an imaging infrared (IIR) sensor in some embodiments. The ISLD 26 also has the multiple detector elements coupled to associated electronic interface circuits (not shown). The interface circuits are then coupled to an illuminated-spot centroid determination (ISCD) circuit 23. In various embodiments, the optical aperture 24, imaging system 34, SAL detector 25 and ISCD circuit 23 form a centroid-locating sensor 29 as described in more detail herein. It further should be noted that although the optical imaging system 34 is illustrated as comprising a single lens, the optical imaging system 34 may comprise multiple refractive, reflective and/or diffractive elements.

The wavelength-selective diffuser 22 homogenizes the intensity of the light in the illuminated spot at the ISLD 26, to enable the ISLD 26 to make a determination of the incidence angle of the light 32, which in the illustrated embodiment is laser light. However the wavelength-selective diffuser 22 in various embodiments is also configured to have reduced or minimal effect on the longer wavelength light so that the image projected onto the FPA imaging detector 28 is well focused and not blurred. It should be noted that atmospheric effects such as turbulence and any damage to or obstructions upon an entrance dome that is in front of the aperture 24 can produce a non-uniform illumination pattern on the optical aperture. This non-uniform pattern at the aperture 24 causes the illuminated spot projected on the ISLD 26 to have a non-uniform intensity distribution, which results in an erroneous estimate of the incidence angle of the laser light. The wavelength-selective diffuser 22 homogenizes the light paths and in various embodiments produces a smooth intensity pattern for the illuminated spot.

It further should be noted that the wavelength-selective diffuser 22 may be positioned at different locations along the optical path 27, such as between the aperture 24 and the optical imaging system 34, within the optical imaging system 34, or between the optical imaging system 34 and the ISLD 26.

In various embodiments, the optical sensor 20 includes the ISLD 26, which is configured as a sensor for light from a semi-active laser (SAL) designator, and the FPA imaging detector 28, which is configured as a sensor for infrared light emitted and/or reflected by a scene. In some embodiments, the FPA imaging detector 28, when configured as a sensor for the light emitted and/or reflected by the scene, is an IIR sensor with an output thereof used to provide an infrared image of the scene. The ISLD 26 configured as a SAL sensor may be used to determine the angle of incidence of the SAL light (relative to the position of the optical sensor 20) that is reflected from one or more objects in the scene (e.g., viewed through the aperture 24). It should be noted that the light to be detected by either sensor (ISLD 26 or FPA imaging detector 28) is collected through the optical aperture 24.

Thus, in various embodiments, the optical sensor 20 has a compact and small diameter design since both of the sensors (ISLD 26 and FPA imaging detector 28) share the same aperture 24 and the same optical focusing system (e.g., optical imaging system 34 that may include one or more refractive or diffractive elements such as lenses, but does not need any reflective elements). By configuring the optical sensor 20 to allow, for example, the LWIR light for the IIR sensor to pass through the SAL sensor, which has high optical transparency to those LWIR wavelengths, the in-line optical configuration is provided, with the components of the optical sensor 20 having a common optical axis.

In various embodiments, the optical sensor may be provided as described in co-pending application Ser. No. 14/030,670, entitled "Systems and Methods for Dual-Mode Optical Sensing", which is incorporated by reference herein in its entirety.

In operation, incident light is projected by the optical imaging system 34 (e.g., optical lens) onto an array of PD elements of the ISLD 26. More particularly, some wavelengths of the incident light can be detected by the PD array and other wavelengths of the incident light pass through the PD array for detection by an imaging detector, illustrated as the FPA imaging detector 28. If the incident light overfills the optical aperture 24, the shape of that aperture can determine the shape of the spot of light projected onto the PD array. The optical imaging system 34 and the optional wavelength-selective diffuser 22 (or other optical diffuser) can be configured to provide a desired overall size and intensity distribution of the spot of light projected onto the PD array, with the location of that spot depending on the AOA.

In various embodiments, the ISCD circuit 23 is coupled with the ISLD 26, and which may be provided as part of the SAL detector 25. However, in some embodiments, the ISCD circuit 23 may be separately provided. The ISCD circuit 23 and SAL detector module 25 in combination with the optical aperture 24 and SAL detector 25, and optionally with the optical imaging system 34, or other optical focus elements, and the wavelength-selective diffuser 22 (optical diffuser), provides a determination of the AOA of light, such as from a distant object that is collected by the aperture 24 and projected onto the PD array. The ISCD circuit 23 also can determine the angle of arrival of a narrow beam of laser light that passes un-occluded through the aperture 24 and illuminates the PD array.

The centroid-locating sensor 29 operates as an AOA sensor in various embodiments and can have a large instantaneous field of view (FOV), while also having large measurement bandwidth (as compared to conventional 4-quadrant detectors). It should be noted that the measurement bandwidth of the centroid-locating sensor 29 is limited by the response bandwidth of the PD array detector element and a transimpedance amplifier (TIA) as described herein, and by the bandwidth of an associated noise-bandwidth filter. The measurement bandwidth can be at least several MHz and as high as several GHz in some embodiments. In contrast, conventional centroid-locating sensors typically determine the centroid location on a frame-by-frame basis, with the frame rate generally no higher than several tens of kHz.

Thus, in operation, the centroid-locating sensor 29 can detect and discriminate between shorter pulses of light and higher-frequency intensity modulation of the light compared to conventional position sensing detectors that are fabricated from the same light-absorbing materials. For a given FOV, the number of array elements, and thus the size of the PD elements, can be designed to achieve a desired noise performance and a desired sensitivity to lower intensity levels of the illuminating light. Furthermore, by using a smaller-size spot for the light projected onto the array (in contrast to the large-size spots generally used for conventional centroid determining PD arrays), the centroid-locating sensor 29 can have a higher signal per illuminated element of the array, which improves the sensitivity of the disclosed AOA sensor as well as the angle-determination accuracy.

In various embodiments, the ISCD circuit 23 of the centroid-locating sensor 29 operates to provide a continuous-time output that indicates the location of the centroid of the spot of light projected onto the PD array, with the location represented as a pair of binary numbers indicating the x-displacement and the y-displacement of that spot. The sub-element angle-determination resolution enables the centroid-locating sensor 29 to have fewer array elements and fewer electronics channels. Also, because the ISCD circuit 23 processes the photo-detected output for each array element as a binary value, instead of as an analog or grey-scale value, the electronic circuitry is simplified. For example, the spatial filtering function of the ISCD circuit 23 can be implemented with digital logic circuits. Additionally, the ISCD circuit 23 can be implemented using binary adders, dividers and gates. With latency-matched circuitry, the centroid-locating sensor 29 can have an output rate that is set by the measurement bandwidth, unlike conventional centroid-locating PD arrays having an output rate that is determined by the rate of the frame-by-frame addressing and multiplexed serial-readout circuit. Thus, the centroid-locating sensor 29 can provide real-time or almost real-time determination of the location of the illuminating spot on the PD array and of the AOA of the incident light.

Various embodiments of centroid locating and angle-of-arrival determining sensors described herein can be used, for example, for guiding a steerable projectile. Additionally, the laser-guided devices may be sensitive to 1.06 µm wavelength, as well as eye-safe wavelengths such as 1.5 µm, 2.2 µm and 3.8 µm. The detection in these wavelengths using detector material in the various embodiments that are suitable for absorbing such wavelengths of light have both the capability of providing a large instantaneous field of view, which is useful for initial target acquisition, and the ability to sense and discern short pulses of incident light, which may be used for discriminating between the laser-light reflected from an intended target and the back-scattered clutter or false-target reflections.

The various embodiments also may be used for pointing an optical receiver. Such an optical receiver may be used, for example, in a free-space optical communications link or in a laser radar system. The large field-of-view facilitates laser-beam alignment and the wide bandwidth signal response of the centroid-locating sensor 29 allows the detection of time-coded waveforms. Also, the high sensitivity enables the centroid-locating sensor 29 to detect weaker input signals.

The centroid-locating sensor 29 also may be used for measuring the distance to an object or the three-dimensional shape of an object by using optical triangulation. For example, the centroid-locating sensor 29 may be placed at two or more locations along a baseline to detect the angles-of-arrival of light reflected from or emitted by the object. Thus, various embodiments may be used as part of distance and shape measurement instruments.

Figure 2:
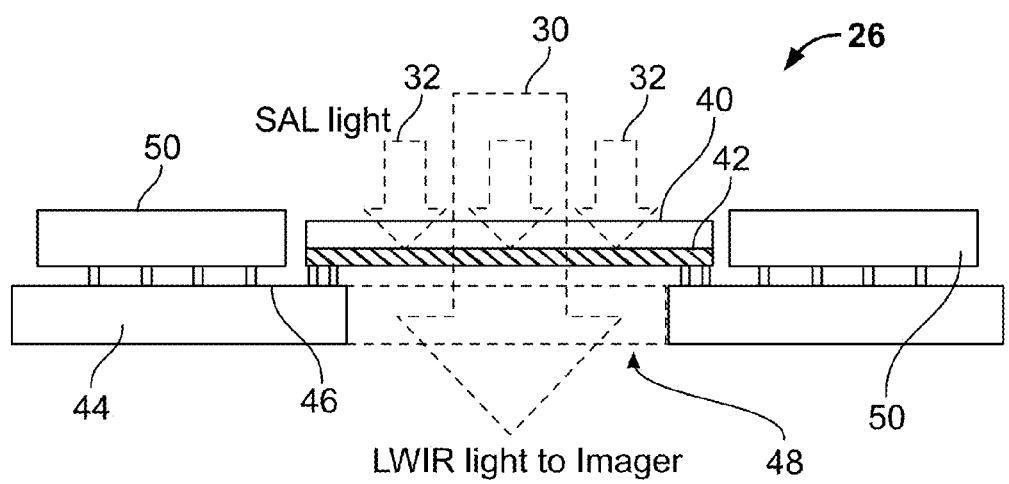
FIG. 2 is a schematic illustration of an illuminated-spot locating detector (ISLD) in accordance with an embodiment.

FIG. 2 illustrates the SAL detector 25 and ISLD 26 formed in accordance with various embodiments, wherein the ISLD 26 includes an ISLD substrate 40 coupled with an ISLD absorber 42, illustrated in a dual layer configuration. The ISLD 26, which is configured as a SAL seeker in this embodiment, includes multiple detector elements (formed as part of the ISLD substrate 40 coupled with an ISLD absorber 42) that are capable of detecting light of wavelengths emitted by the laser designators (e.g., the light 32), with the ISLD 26 having high transparency to longer wavelength light, such as the LWIR light (e.g., the light 30) to be detected by the FPA imaging detector 28 (shown in FIG. 1) of the IIR sensor. The SAL detector 25 also includes an interconnect base 44 (e.g., a base substrate or support structure) that can contain electrical interconnect paths 46 (e.g., electrical traces on a substrate). The base 44 in this embodiment includes an opening 48 formed therein that is aligned at least in part with the ISLD substrate 40 coupled with the ISLD absorber 42. For example, in the illustrated embodiment, the opening 48 is formed through the entire base 44 at a central portion or region of the interconnect base 44. As can be seen, the ISLD 26 (formed from the ISLD substrate 40 and the ISLD absorber 42) is mounted upon the interconnect base 44 in proximity to the opening 48, such as aligned with the central portion of that interconnect base 44 in this embodiment.

It should be noted that electronic circuits 50 may be mounted to the interconnect base 44. For example, the electronic circuits may include electronic interface circuits and the ISCD circuit 23 as described in more detail herein. The interface circuits and the ISCD circuit 23 are mounted upon the interconnect base 44 a distance from the opening 48, which is away from the central portion of the base 44 in this embodiment, such as not to block the LWIR light passing through the opening 48. For example, the light 30 to be detected by the FPA imaging detector 28 is projected by the optical imaging system 43 (shown in FIG. 1) to pass through the ISLD 26, through the opening 48 (in the central portion of the interconnect base 44), and onto the FPA imaging detector 28. It should be noted that the components coupled to the base 44 may be mounted thereto using any suitable means, such as by soldering, with bump bonds, or with other suitable electrical interconnects. For example, chip-to-chip or chip-to-base coupling can be used to electrically couple the ISLD 26 to the interconnect base 44. Additional solder bumps, etc. may be used to couple the interconnect base 44 to the interface circuits 50 and the ISCD circuit 23.

Thus, in the illustrated embodiment, the optical sensor 20 has the wavelength-selective optical diffuser 22 that diffuses or spreads the laser light, but that minimally diffuses or spreads the LWIR light. Additionally, the optical imaging system 34, such as a lens or compound lens, projects and focuses the LWIR light onto the FPA imaging detector 28 and that, in combination with the wavelength-selective optical diffuser 22, projects onto the ISLD 26 an illuminated spot that simultaneously or concurrently overlaps with a plurality of light-detecting elements of the ISLD 26. For example, the ISLD 26 may comprise multiple light-detecting elements that are formed on a common substrate, such as the ISLD substrate 40. Each light detecting element contains an absorber region, which may be formed with the ISLD absorber 42 and that comprises, in some embodiments, a direct-bandgap semiconductor material that absorbs the SAL light (of the second wavelength range), but that has reduced or minimal absorption of the LWIR light (of the first wavelength range). Thus, the ISLD substrate 40 is configured or formed to have reduced or minimal absorption for light of the first wavelength range and also reduced or minimal absorption for light of the second wavelength range. For example, is some embodiments, the ISLD absorber 42 can comprise a material such as InGaAs or HgCdTe, among others, and the ISLD substrate 40 can comprise a material such as InP or GaAs or CdTe, among others. The absorber regions of the ISLD absorber 42 are located adjacent to a first surface or face of the ISLD substrate 40 (illustrated in FIG. 2 as a lower face closer to the interconnect base 44). In some embodiments, the wavelength-selective optical diffuser 22 (shown in FIG. 1) can be formed on a second surface of the ISLD substrate 40 that is opposite the first surface (e.g., on a top surface of the ISLD substrate 40 as viewed in FIG. 2).

In an exemplary embodiment, the ISLD 26 has an InGaAs absorber 42 on an InP substrate 40 that enables the ISLD 26 to be suitable for detecting laser light of 1.0-1.65 µm wavelength. It should be noted that InGaAs has a direct bandgap and thus an absorption efficiency that is very high. For example, an InGaAs layer having a thickness of approximately 3 µm is sufficient to absorb almost 100% of the laser light that is coupled into that layer. In various embodiments, the ISLD 26 has a PIN photo-diode structure, but other light-detecting device structures such as an avalanche photodiode also may be used. In one embodiment, the InGaAs absorber regions, when not illuminated, would be depleted of free carriers and would comprise the I-layer of the PIN structure. The electrically conductive P-layer and N-layer comprise material such as InP that is lattice matched to the InGaAs material and that is transparent to the laser wavelengths (as well as to the LWIR light). The capacitance per unit area of the PIN structure is fairly large, since the I-layer is fairly thin. An exemplary value is $0.5 \times 10^{-4}$ pF/µm$^2$. Each PIN detector has a fairly small area in order to achieve fast response. The large-area ISLD desired for having large FOV is thus achieved by having an array with many smaller-area PIN detectors. It should be noted that the variously described materials and component values may be changed as desired or needed.

It should be noted that the thickness of the absorber regions in various embodiments is generally smaller than ten times the maximum wavelength of the second wavelength range and can be as small as one times, or even as small as one-half times, the maximum wavelength of the second wavelength range in other embodiments. However, different relative thicknesses may be provided. The ISLD 26 can also have various two-dimensional arrangements of multiple elements. For example, the ISLD 26 can comprise an array of N×N elements, with N being as small as 4 and as large as 80 in some embodiments. However, it should be appreciated that different numbers of elements smaller than 4 and greater than 80 may be provided, and the array may have a configuration other than a square, for example, a rectangle, octagon, or other polygon shape, among others. The ISLD 26 may be provided as described herein, such as a detector array. However, different types of ISLDs may be provided, for example, using a quadrant detector (formed from silicon or other materials).

It should be noted that the SAL light is illustrated as first passing through the ISLD substrate 40 before that light is absorbed by the detector elements of the array formed in the ISLD absorber 42. For such a configuration, the ISLD substrate 40 is transparent to the SAL light. However, the SAL light and the LWIR light also may be incident from the side of the ISLD 26 that contains the absorber regions. In this case, the ISLD substrate 40 is also transparent to the LWIR light, but can absorb the SAL light. Other configurations are contemplated, for example, in which the ISLD substrate 40 is removed or the interconnect base 44 is transparent.

The optical sensor 20 can have a large instantaneous FOV for both the SAL sensor and the IIR sensor even though both of the sensors are mounted in the projectile in a body-fixed configuration rather than being placed on a gimbal that can move the pointing direction of those sensors. The overall instantaneous FOV of the ISLD 26 (or of the FPA imaging detector 28) is determined by the overall lateral size of the ISLD 26 (or of the FPA imaging detector 28) and the effective F-number of the optical imaging system 34. For a typical ISLD, which commonly is a 4-quadrant detector, the overall size of that 4-quadrant detector typically equals twice the width or lateral size of one of the 4 light-detecting elements. The size (e.g., diameter) of the illuminated-spot pattern typically is equal to or slightly larger than the width of one of the light-detecting elements (which typically is >5 mm for 4-quadrant detectors constructed from silicon), such that the spot simultaneously illuminates all 4 detector elements, but the size of the illuminated-spot pattern is smaller than the total area covered by the 4 adjacent detector elements. In contrast to the 4-quadrant detector, the ISLD 26 of the optical sensor 20 may comprise from, for example, 16 to greater than 10,000 elements and the optical imaging system 34 and that ISLD 26 are configured to project an illuminated spot that simultaneously overlaps more than four adjacent light-detecting elements of the ISLD 26.

In various embodiments, the optical sensor 20 can provide an imaging-seeker guided device with an upgraded capability of SAL designated guidance. Also, the optical sensor 20 can provide a SAL-seeker guided product with an imaging capability that can be especially beneficial for terminal guidance. Additionally, the optical sensor 20 can be used in a body-fixed configuration.

More particularly, the optical sensor 20 is able to provide very fast response, and large response bandwidth, while also having a large instantaneous FOV when used in a strap-down configuration (without any gimbal to change the pointing direction of that sensor).

In various embodiments, a large-area ISLD 26 that comprises an array of multiple detector elements is used wherein the multi-element arrayed ISLD 26 connects each element of the array to a separate electronic interface circuit that converts the photocurrent generated by each array element of the ISLD 26 into an amplified electrical signal waveform. The centroid-locating sensor 29 is configured to determine the centroid of the illuminated spot pattern as described in more detail herein.

Figure 3:
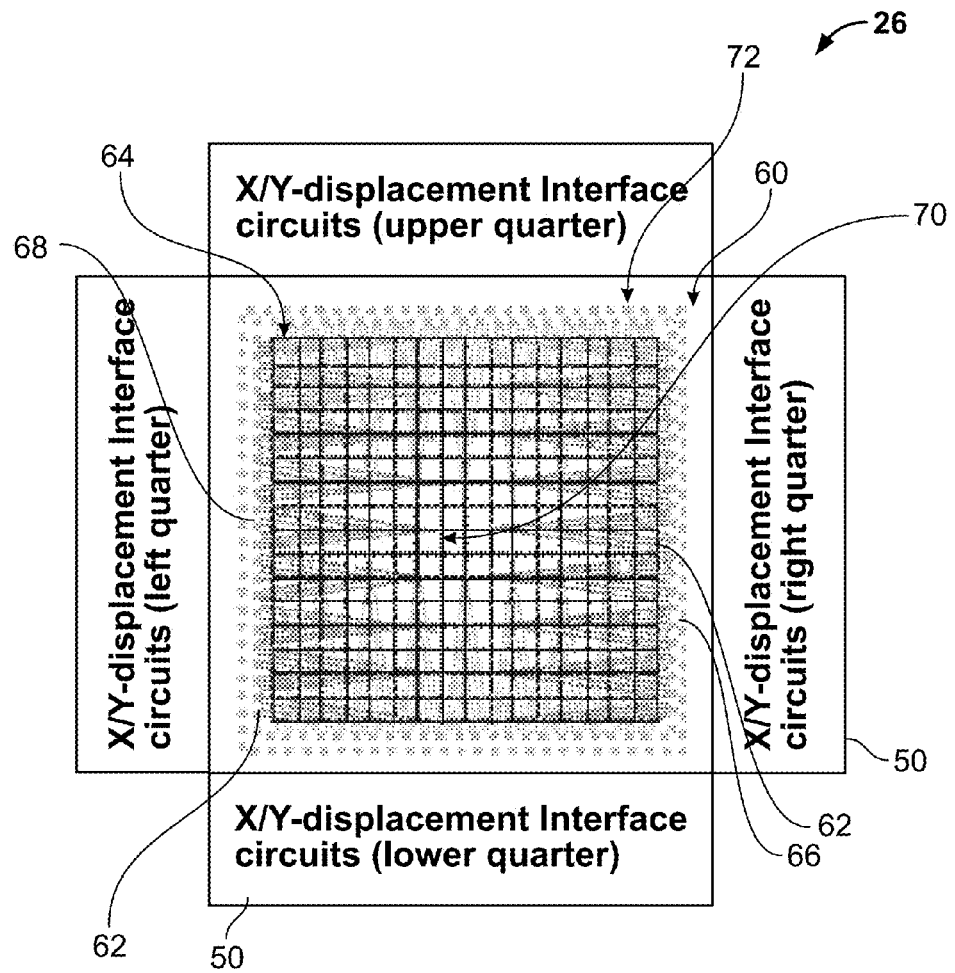
FIG. 3 is an illustration of a detector array of an ISLD in accordance with an embodiment.
Figure 4:
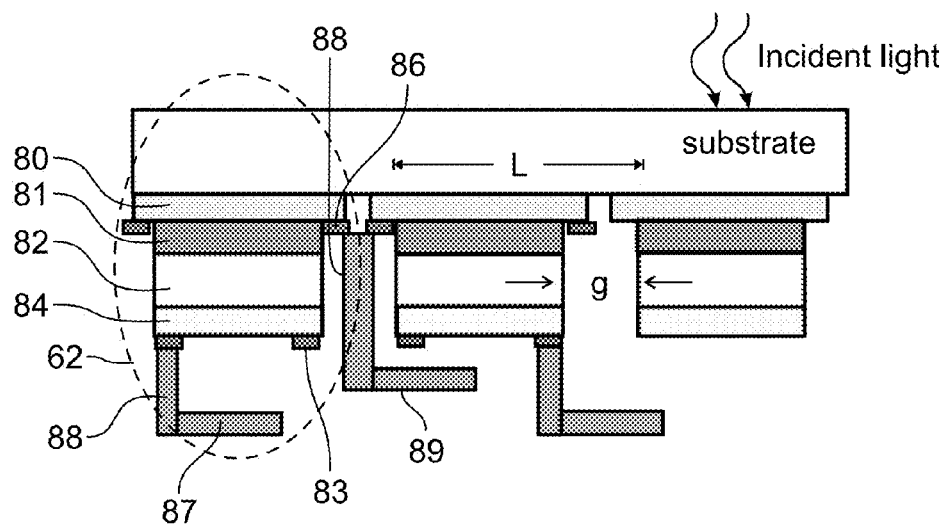
FIG. 4 is another illustration of a detector array of an ISLD in accordance with an embodiment.
Figure 5:
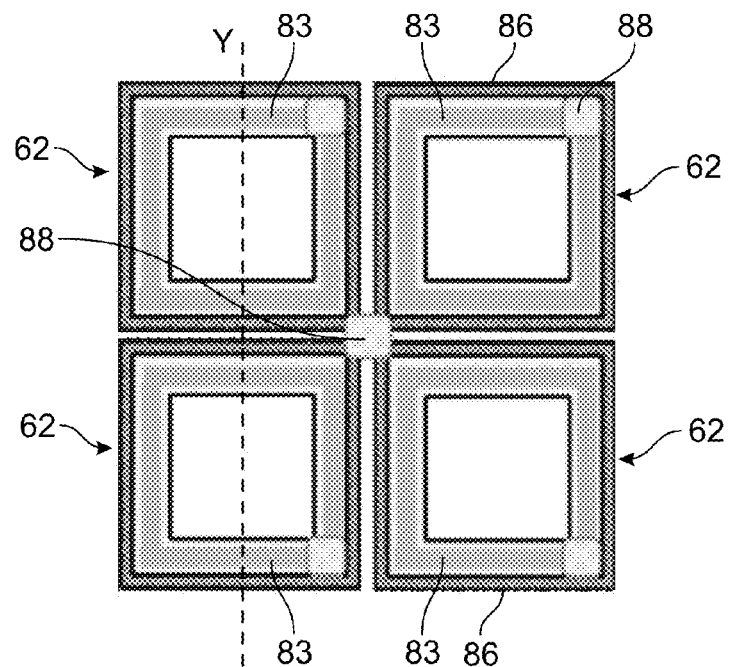
FIG. 5 is another illustration of a detector array of an ISLD in accordance with an embodiment.

FIGS. 3-5 illustrate a PD array 60 (shown as a two-dimensional array) of detectors 62 (also referred to as PD detector elements 62 or PD elements 62), with an exemplary rectangular grid arrangement. However, other geometric arrangements and shapes of the detectors in the array may be provided, such as hexagonal close-packed arrangements or triangular arrangements. Each PD element 62 in one embodiment is spaced close to adjacent PD elements 62 (e.g., within 0.1 millimeters). In the illustrated embodiment, the PD elements 62 are formed from an n-conductor layer 80 (e.g., of n-type doped InP material), an absorber layer 82 (e.g., of undoped or unintentionally doped InGaAs material lattice matched to InP) and a p-conductor layer 84 (e.g., of p-type doped InP material), thereby forming a PIN photodiode structure. These layers are typically formed on a substrate 40 (e.g., of InP material). Each PD element 62 in the illustrated embodiment includes an electrode 83 (illustrated as a ring electrode) electrically coupled to the p-conductor layer 84, with an interconnecting post 88 electrically coupling an electrode 85 to an additional laterally extending metal-interconnect line 87. In one embodiment, each group of four adjacent PD elements 62 include a second electrode 86 electrically coupled to the n-conductor layer 80 of the PD elements 62. It should be noted that the interconnecting post 88 electrically couples the shared electrode to another additional laterally extending metal-interconnect line 89.

A PD element 62 can have the absorber layer 82 formed, for example, from a direct-bandgap semiconductor material such as GaAs, InGaAs, InAsSb, InAs, InSb and/or HgCdTe. The n-conductor and p-conductor layers 80 and 84 in some embodiments are formed from a material having a lattice constant that is approximately matched to the lattice constant of the absorber material of the absorber layer 82. In one embodiment, the material of the conductor layer 84 that is located between the absorber layer 82 and the direction from which the light is incident is formed from a material that is transparent to the incident light. For example, if the absorber material is InGaAs for detecting light of 1.05-1.65 μm wavelength, the conductor layer material may be InP. The PD elements 62 also may include an avalanche carrier-multiplication structure 81, which provides carrier-selective impact ionization in some embodiments. An electron-multiplier material or structure (e.g., InAlAs, InAlAs/InGaAlAs, InAs, or HgCdTe) can provide low-noise gain for the absorber materials. The resulting avalanche photo-diode detector in various embodiments can be operated in a "linear mode" regime to provide linear gain. Accordingly, the output current of a PD element 62 is still proportional to the intensity of the light illuminating that element. Alternatively, the avalanche photo-diode detector in various embodiments can be operated in a "Geiger-mode" regime, providing non-linear gain.

In various embodiments, the PD elements 62 are positioned close to each other to reduce or minimize the width of the gaps between adjacent PD elements 62. This placement increases or maximizes the amount of light that is collected by the PD elements 62. The detector array 60 in various embodiments is located near the center of the ISLD 26 as described herein. In one embodiment, each PD element 62 also has at least one electrical contact between the PD element 62 and one or more bond pads 66 located at the periphery 64 of the array 60. The electrical contact for a given PD element 62 in some embodiments is located in such a manner that increases or maximizes the area through which the laser light can be collected and detected, such as at the periphery of the PD element 62. In one embodiment, the metal interconnect lines 68 between the PD elements 62 and corresponding bond pads 66 are routed in a way that reduces or minimizes the blocking or obstruction of the LWIR light, which passes through the ISLD 26, having bond pads 66 located at the periphery 64 of the ISLD 26 and outside of the area occupied by the array of PD elements 62. As illustrated in FIG. 3, the density of the interconnect lines 68 (shown in a triangular type of pattern) is also greatest near the edges of the array 60 and the ISLD 26 has greater transparency in a central portion 70. Thus, the center of the FOV of the imager has the best sensitivity.

Moreover, the electronic circuits 50 (illustrated in this embodiment as X and Y displacement interface circuits to determine the location of a detected light spot as described herein) associated with the SAL sensor are located beyond the outer edges 72 of the ISLD 26. The electronic circuits 50 can, for example, surround all four sides of the ISLD 26. It should be noted that the SAL sensor is located closer to the optical imaging system 34 (e.g., lens) than the IIR sensor. If the desired FOV of the IIR sensor is equal to or smaller than the desired FOV of the SAL sensor, the light to be detected by the IIR sensor would only need to pass through the ISLD portion of the SAL sensor (as such, the electronic circuits 50, which at the least have metal portions that may block and/or absorb the light, are positioned at the periphery of the array 60).

The optical sensor 20 in various embodiments is configured having selected values of parameters, for example, for the location of the ISLD 26 relative to the optical imaging system 34 or the FPA imaging detector 28, the size of the light-detecting area of the ISLD 26 and the number of the PD elements 62 in the ISLD 26. For example, the desired size of the ISLD 26 depends on the desired FOV as well as on the size of the spot of laser light projected onto the ISLD 26. Ideally, the entire spot of laser light should overlap some detector elements 62 even when that spot is moved to the limits of a region of motion, associated with the edge of the FOV. However, it should be appreciated that in some embodiments, a portion of the spot of laser light overlaps some of the PD elements 62.

Figure 6:
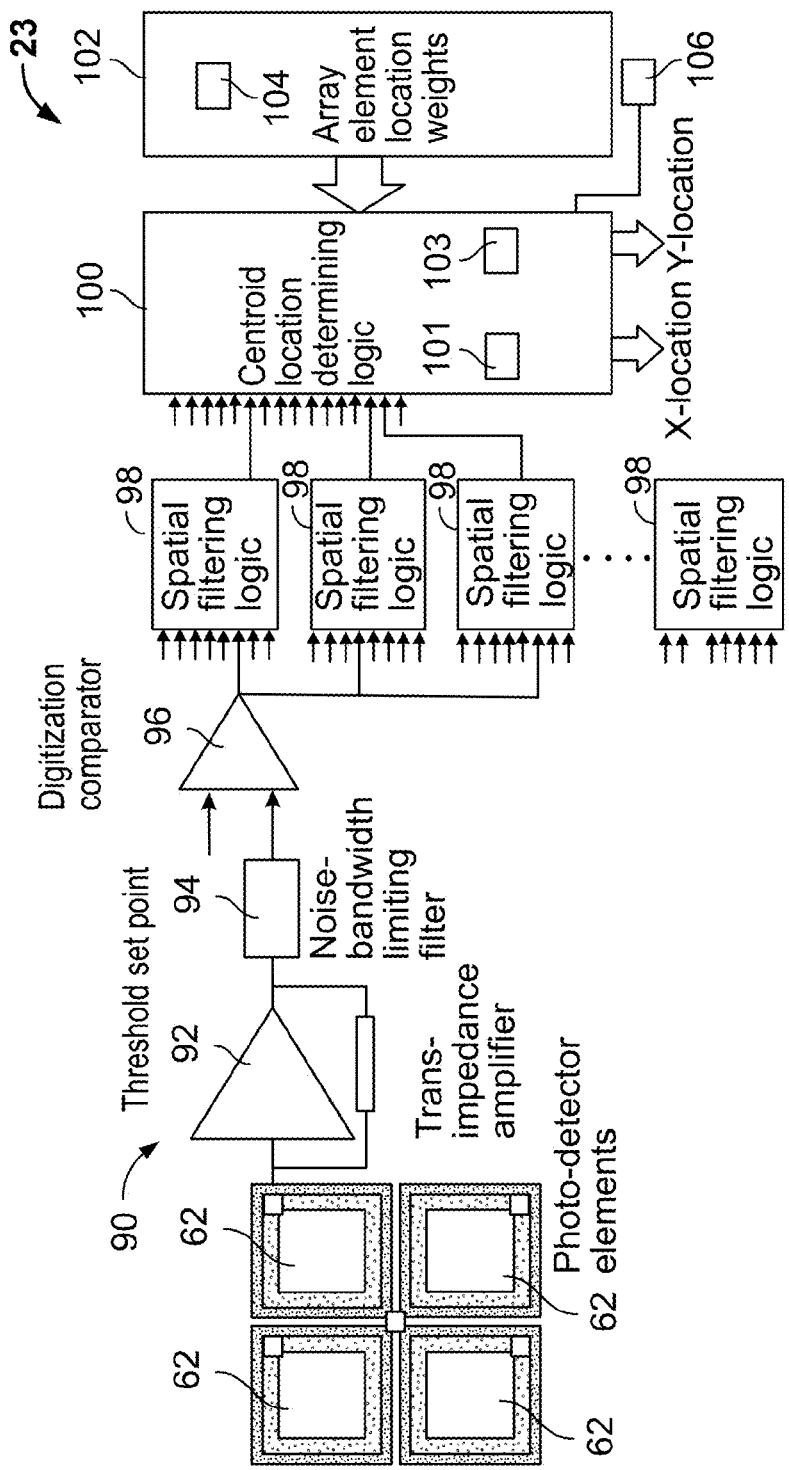
FIG. 6 is a schematic illustration of a centroid-locating sensor in accordance with an embodiment.

In operation the detector array 60 is associated with electronic circuitry that determines the location of the spot of light projected onto the detector array 60. FIG. 6 illustrates a schematic block diagram of a portion of the centroid-locating sensor 29 that is configured to operate as an AOA sensor. FIG. 6 illustrates the electronic amplification, pre-processing, and location determination components of the centroid-locating sensor 29, which are used to provide AOA operation.

In particular, in the illustrated embodiment, each PD element 62 is connected to an interface circuit 90 that includes an electronic preamplifier, illustrated as a trans-impedance amplifier (TIA) 92, a noise-bandwidth limiting filter 94 and a digitization comparator 96. It should be noted that FIG. 6 illustrates circuitry connected to one of the PD elements 62 for ease of explanation. However, similar circuitry is connected to each of the PD elements 62.

The TIA 92 is configured to provide signal amplification and also converts the photo-current input from the PD elements 62 to a voltage output. The centroid-locating sensor 29 also includes a noise-bandwidth limiting filter 94 connected to the output of the TIA 92. It should be noted that in some embodiments the frequency-domain filtering function may be implemented by the TIA 92. For example, in various embodiments the noise-bandwidth limiting filter 94 is used to set the bandwidth of the noise, for example, to cause that noise bandwidth to be no larger than the anticipated bandwidth of the optical signal pulses detected by PD element 62.

The noise-bandwidth limiting filter 94 is connected to one input of a digitization comparator 96. The other input of the digitization comparator 96 receives a control signal setting a threshold (threshold set point) for determining whether light is incident on the associated PD element 62. In operation, the noise filtered waveform is digitized with the digitization comparator 96 that produces a binary 1 output level when the amplitude of the input waveform exceeds a threshold setpoint and produces a binary 0 output otherwise. It should be noted that for optical input to a PD element 62 that comprises a set of optical pulses of varied intensity and varied pulse-to-pulse separation, the digitized time-varying waveform for that PD element 62 resembles a set of pulses of equal magnitude and varied pulse-to-pulse separation when the intensity of the input optical pulses exceed a value associated with the threshold set-point of the digitization comparator 96.

The digitization comparator 96 is connected to a plurality of spatial filtering logic circuits or modules 98 (which form and also are referred to herein as a spatial filter). It should be noted that the output of the digitization comparator 96 from different ones of the PD elements 62 are connected to different inputs of the spatial filtering logic circuits or modules 98. For example, in the illustrated embodiment, the output of the digitization comparator 96 for the particular PD element 62 coupled to the illustrated TIA 92 is connected to the third input of the upper spatial filtering logic circuit 98 (although different inputs may be used and the use of the third input is merely for example). Also, the output of the illustrated digitization comparator 96 can be further connected to the fourth input of another spatial filtering logic circuit 98 and additionally connected to the sixth input of yet another spatial filtering logic circuit 98.

Thus, in operation, in some embodiments, digitized outputs for a PD element 62 and for immediately adjacent elements (generally along both of the orthogonal axes of the array 60, e.g., X and Y) are fed to the spatial filtering logic circuits 98. In the illustrated embodiment, only four PD elements 62 are shown. However, additional PD elements 62 may be adjacent to a particular PD element 62. The spatial filtering circuits 98 determine whether the output for the PD element 62 was produced by the photo-current from light that is part of the illumination spot or by noise. The spatial filtering circuits 98 then reject the noise contribution, by resetting the output ($A_{ij}$) for that PD element 62 to zero as described herein.

The outputs of the spatial filtering circuits 98 are connected to a centroid location determining logic circuit or module 100. In operation, the outputs of the spatial filtering circuits 98 are fed to the centroid location determining logic circuit or module 100 for each of the two axes. The centroid-location determining logic 100 uses a procedure such as defined in the following equation, with $A_{ij}$ having a value of either 1 or 0:

$$CL_x = \frac{\sum_{i=1}^{x}\left(\sum_{j=1}^{y} W_i \cdot A_{ij}\right)}{\sum_{i=1}^{x}\left(\sum_{j=1}^{y} A_{ij}\right)} \qquad \text{Eq. 1}$$

$$CL_y = \frac{\sum_{j=1}^{y}\left(\sum_{i=1}^{x} W_j \cdot A_{ij}\right)}{\sum_{j=1}^{y}\left(\sum_{i=1}^{x} A_{ij}\right)} \quad \text{Eq. 2}$$

The centroid location determining circuit 100 uses two sets of weights $W_i$ and $W_j$ that indicate the respective column or row in which the PD element 62 having the output value that is $A_{ij}$ resides. In one embodiment, an array element location weights component or module 102 (which may have weighting values stored in a memory 104 (e.g., memory area)) provides binary weight values to the centroid location determining logic circuit or module 100. In some embodiments, the centroid location determining circuit 100 performs a summed multiplication of the weight value with the binary element output values by using a binary addition of the weight value for the row (or column) for each occurrence of a 1 value for the array-element outputs of that column (or row). The summed column values are then added to determine the summed weight-factor for the row (or column), i.e., the numerator of Equation 1 (or 2). The denominator of Equations 1 and 2 can be determined in various embodiments by a counter 106 that increments for each element having $A_{ij}=1$. The centroid location along the x-axis (or y-axis) is then obtained by a binary division operation, with a pre-specified precision (e.g., within a predetermined tolerance range). The output of the centroid location determining logic circuit or module 100 is two binary numbers that represent the X-location and the Y-location of the illuminated spot on the detector array 60.

Figure 7:
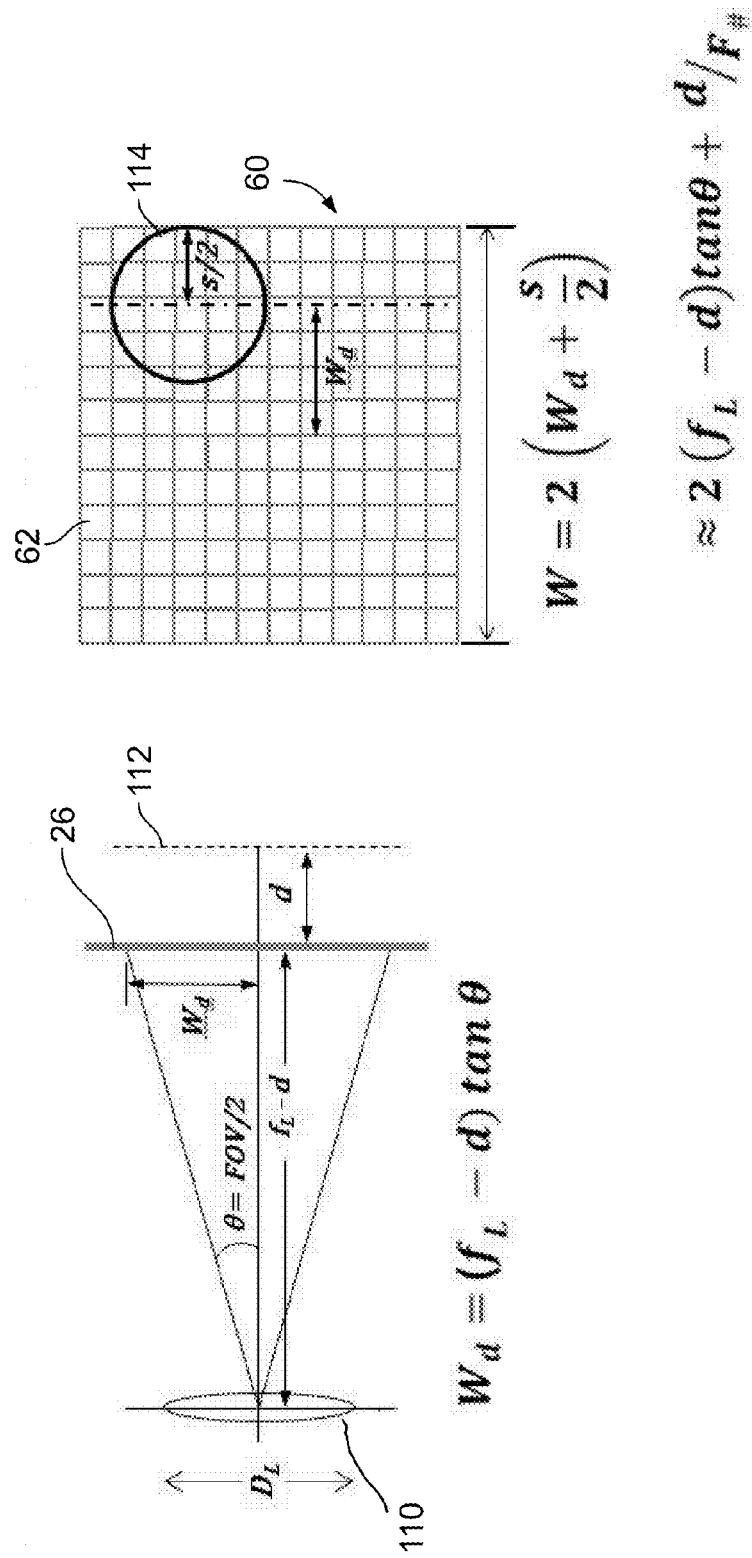
FIG. 7 is an illustration of determining a size of an illuminated spot of laser light in accordance with an embodiment.

In various embodiments, the size of the spot of light projected onto the detector array 60 is smaller than the overall size of the array 60 as illustrated in FIG. 7. FIG. 7 illustrates a detector array 60 of an ISLD 26 that has a square shape. However, the detector array 60 may have an outline or contour of other shapes such as a circle, ellipse or rectangle. The minimum overall size W of the detector array 60 of PD elements 62 thus depends on the FOV, the effective diameter and focal length of the optical imaging system 34, illustrated as a lens 110, (or the F-number, F#, of the optical imaging system 34) and the offset distance, d, of the ISLD 26 from the focal plane 112 associated with the wavelength of the laser light.

The size of the spot of light 114 illuminating the detector array 60 likewise is dependent on the effective diameter $D_L$ and focal length $f_L$ of the lens 110 (or on the effective F-number F# of the lens 110) and on the offset distance d of the ISLD 26 from the focal plane 112 associated with the wavelength 2 of the laser light.

When the optical sensor 20 has an IIR sensor with a microbolometer FPA, a fast lens such as one with an F-number of F/1 may be used in order to collect more light and to enable the overall size of the FPA imaging detector 28 to be smaller. It should be noted that as the ISLD 26 is moved closer to the lens 110 (and as the value for d becomes larger), the size of the laser-illuminated spot 114 on the detector array 60 becomes larger. Additionally, the incidence angle of the light producing the laser-illuminated spot 114 may be determined as described in more detail herein.

In operation, the location of the spot of light 114 projected onto the detector array 60 changes as the angle of incidence θ' for the input light changes. The maximum excursion $W_d$ of the center of the projected spot of light 114 is determined by the desired angular field of view (FOV) for the optical sensor 20 operating as an AOA sensor. The overall size of the array 60 in various embodiments is sufficiently large to accommodate the entire spot of light 114 when the spot of light 114 is translated to a maximum excursion away from the center of the array 60. Thus, the overall array size W is determined by parameters such as the F-number of the lens 110 ($F_\# = f_L/D_L$), the focal length $f_L$ of the lens 110, the offset distance d between the location of the PD array 60 (along the optical axis of the lens 110) and the focal plane 112, and the desired angular FOV (=2θ) for the AOA sensor. It should be noted that the diameter s of the projected spot of light 114 also can be enlarged to a desired value by using a suitably designed optical diffuser, even when the PD array 60 is located at the focal plane 112 of the lens 110.

With reference to FIG. 7, the displacement $W_d'$ of the centroid of the illuminated spot 114 from the center of the detector array 60 can be expressed by $W_d'=(f_L-d)\tan\theta'$, where θ' is the angle of arrival of the incident light. Thus, a calculation of the displacement $W_d'$ of the illuminated spot of light 114 on the detector array 60 also provides an estimate of the angle of arrival of the light collected by the aperture and projected as the spot of light 114 on the detector array 60.

With respect to the estimation of the angle of arrival of light, as discussed in more detail herein, the optical sensor 20 in various embodiments is configured to achieve high-accuracy (low error) estimation of the angle of arrival of the input light and of the location of the centroid of the illuminated spot of light 114, including high AOA-estimation accuracy even for low levels of the incident light. Various different parameters will now be discussed including the effects of the illuminated spot diameter, the noise-bandwidth limiting filter 94, the spatial filter, and the number of array elements.

A MATLAB® software simulator was used analyze the performance of the optical sensor 20. The simulator accepted user-specified parameters such as the desired angular field of view, the focal length and F-number of the lens, the 3-dB bandwidth of the noise-bandwidth limiting filter 94, and the noise models for the PD elements 62 and the TIA 92. The initial analyses assumed that the size of the illuminated spot of light 114 was determined exclusively by defocusing that spot of light 114 (by moving the detector array 60 away from the focal plane 112 and toward the lens 110). The analyses also assumed, as a simplifying approximation, that the optical diffuser acted to produce uniform illumination of the spot of the light 114 on the detector array 60 (i.e., having a flat top or pillbox intensity profile) without affecting the width of the spot of light 114. The simulator used the detector and TIA models to determine the noise and response bandwidth of the PD elements 62 in the detector array 60. The simulator then calculated the signal-to-noise ratio (SNR) for the output of each array PD element 62, assuming some measurement bandwidth, which can be smaller than the PD-limited or TIA-limited bandwidth. Although the incident light can cover the entire top-surface area of those PD elements 62 located near the center of the illuminated spot of light 114, the incident light overlaps only a portion of the surface area of the PD elements 62 located at the edge of the illuminated spot of light 114. Thus, the SNR would be lower for those PD elements 62 located at the edge of the illuminated spot of light 114. The simulator then used a Monte Carlo technique, considering many possible randomly selected locations of the illuminated spot of light 114, to calculate the mean error obtained in the estimation of the centroid locations.

Figure 8:
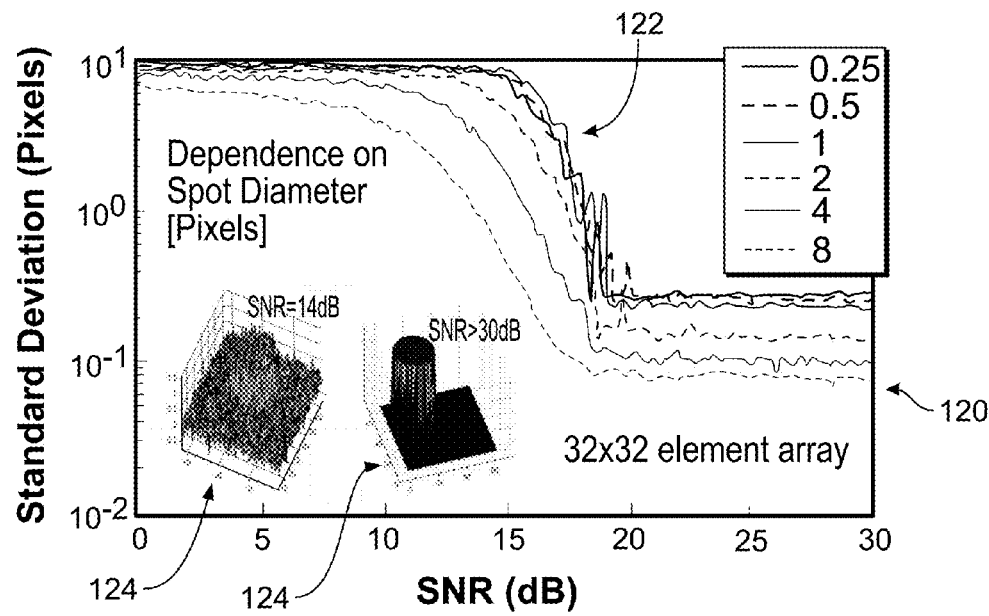
FIG. 8 is a graph of signal-to-noise ratio for a fully illuminated detector element.

The amount of light collected by the input aperture is fixed. Thus, as the size of the illuminated spot of light 114 is enlarged, the intensity of the light illuminating a given PD element 62 is reduced because the light is spread over more PD elements 62. FIG. 8 is a graph 120 illustrating that the centroid-location estimation error is fairly small, smaller than the lateral extent of a PD element 62, when the SNR is sufficiently high (>18 dB in power), but is poor when the SNR is much lower than this value (e.g., <15 dB). The different curves 122 are plotted for different values of the illuminated-spot diameter, which is given in terms of the number of PD elements 62 (or pixels) along one lateral direction that are overlapped by the spot of light 114. Considering the high-SNR regime, it should be noted that when the spot of light 114 overlaps more PD elements 62, the error in the centroid-location estimation is reduced. Also, with respect to the minimum value for the SNR needed to reach the high-SNR regime, it should be noted that this minimum SNR is reduced when the spot size is made larger. The exemplary simulations herein consider the simplified case in which the illuminated spot of light 114 has a flat-top, uniform intensity profile (as illustrated by the images 124).

Figure 9:
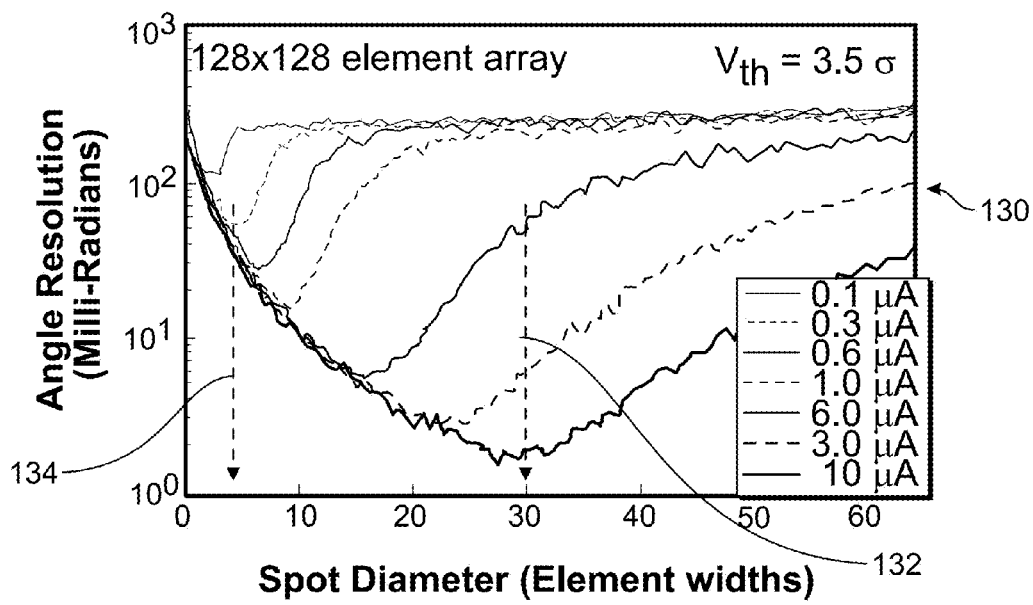
FIG. 9 is a graph of angle of arrival (AOA) estimation resolution.
Figure 10:
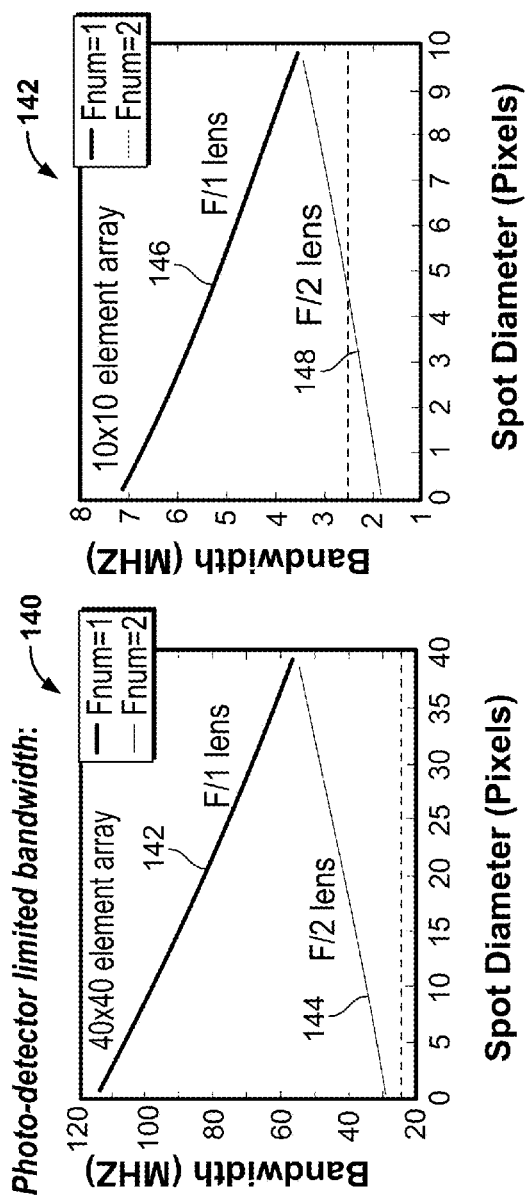
FIG. 10 are graphs illustrating photo-detector bandwidth versus spot diameter.
Figure 10:
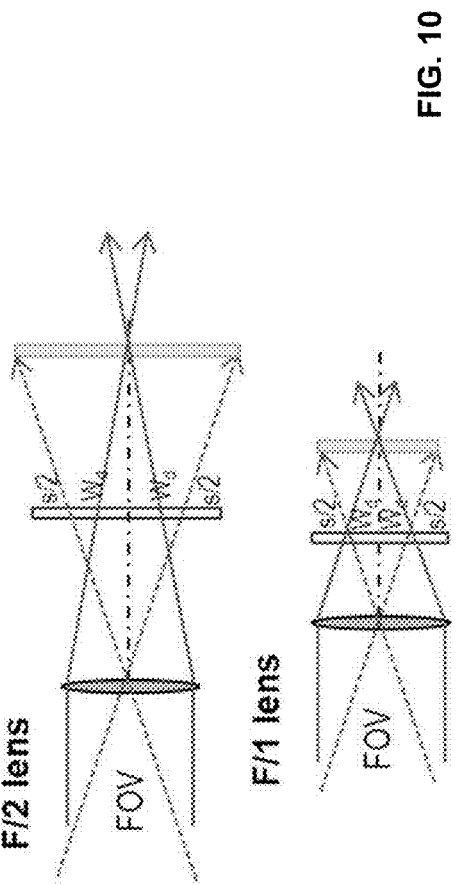

The centroid location can be related to the AOA of the incident light, as described above. FIG. 9 is a graph 130 showing an example of the calculated angle-estimation resolution plotted versus the spot diameter. This result was obtained for an array that has 128×128 PD elements 62. Since the FOV is fixed, an array with more elements has PD elements 62 with smaller capacitance and thus a higher PD-limited bandwidth. The results plotted in FIG. 9 show that for each illumination level of the illuminated spot 114 (or for each value of the total photocurrent, summed from all of the PD elements illuminated by spot 114) there is an optimal value of the illuminated-spot diameter for which the angle-estimation resolution is finest (and the angle-estimation error is smallest). For this example, the optimal spot diameter is approximately equal to 30 times the width of an array element or pixel when the total photo-current is 10 μA (illustrated by the arrow 132). For a different value of the total photo-current, the optimal value of the illuminated-spot diameter is different, such as a spot diameter of approximately 4-5 times the width of an array element for a total photo-current of 0.3 μA (illustrated by the arrow 134). As the spot diameter is increased beyond the optimal value (associated with a given illumination level), and the signal on the illuminated PD elements 62 is reduced, the SNR is made lower and the sensor is no longer in the high-SNR regime. The curves plotted in FIG. 10 illustrate that the optimal spot diameter becomes smaller and smaller as the total photo-current generated by the illuminated spot is reduced. One approach to keep the SNR of each array element the same is to distribute the total photo-current over fewer array elements when that total photo-current is reduced. It should be noted that in the simulation having the results as shown in FIG. 9, the noise contributed by each array channel decreases slightly as the spot diameter is enlarged by moving the PD array 60 farther from the focal plane 112.

With reference again to FIG. 9, the graph 130 also shows that for the lower values of the total photo-current, the best angle resolution is substantially poorer. But, it may be desirable to have an AOA sensor that not only has fine angle resolution, but that can achieve the fine angle resolution at low values of the total photo-current. Various embodiments provide an improved angle resolution over a wider range of photo-current value as described below.

As illustrated in FIG. 7, the overall size of the array 60 is determined by both the maximum excursion of the center of the spot of the light 114 and by the additional area needed to accommodate the radius of the spot of light 114 when that spot of light 114 is located at a maximum excursion. Whether the required detector array 60 size becomes smaller or larger or remains approximately the same as the detector array 60 is moved closer to the lens 110 to defocus the illuminated spot of light 114 and make that spot of light 114 larger depends on the desired field-of-view of the optical sensor 20 and on the aperture size and the F-number of the lens 110. In particular, a simulation was performed to determine the effects of changes in the size of the illuminated spot of light 114 made by varying the offset distance of the detector array 60 from the focal plane 112, and changes in the size of the PD elements 62 made by varying the number of elements in the array 60. It should be noted that moving the offset distance also changes the overall size of the array 60 since the FOV is fixed, as evident from FIG. 7. Thus, changes in the overall size of the array 60, and thus the size and the capacitance of the individual PD elements 62 of that array 60, changes the PD limited bandwidth, as illustrated by the curves 142, 144, 146, and 148 in FIG. 10. The graphs 140 and 142 show exemplary cases for two different lens F-numbers, in particular, with an F/1 lens (by the curves 142 and 146) and with an F/2 lens (by the curves 144 and 148). For the F/2 lens, in this example, the array size is quite large. Thus, as the detector array 60 is moved closer to the lens 110 to enlarge the size of the illuminated spot of light 114, the overall size of the detector array 60 becomes smaller. However, for the F/1 lens, the array size is already smaller when the detector array 60 is located at the focal plane. For this case, when the detector array 60 is moved closer to the lens 110 to enlarge the size of the illuminated spot of light 114, the overall size of the detector array 60 becomes larger. Thus, the PD-limited bandwidth is reduced.

Figure 11:
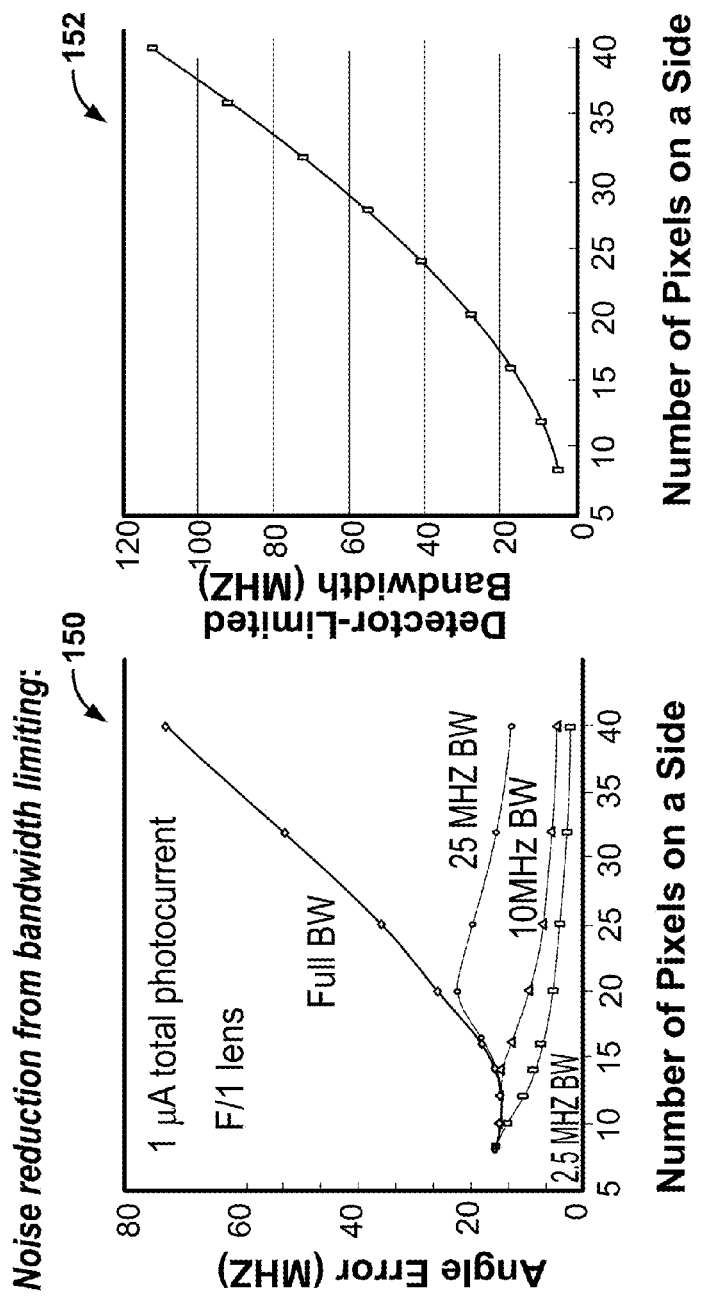
FIG. 11 are graphs illustrating angle error and detector limited bandwidth for a detector array.

FIG. 11 has graphs 150 and 152 that illustrate the effect of the noise-bandwidth limiting filter 94 (shown in FIG. 6). The noise at the output of the TIA 92 depends on the size of the PD element 62 (or pixel). For a fixed FOV and fixed array size, increasing the number of pixels on each side of the array 60 (a square array is assumed in this example) reduces the size of each pixel. The parallel capacitance of the PD element 62 depends on the size of that PD element 62. Thus, the PD-limited response bandwidth is increased as the number of pixels is increased, since the capacitance of the PD element of each pixel is reduced. The noise contributed by an array element or channel, as observed at the input to the digitization comparator 96, can be reduced by having the PD element 62 sufficiently small that the associated PD-limited bandwidth is substantially greater than the bandwidth of the noise-bandwidth limiting filter 94. In this case, any further reduction in the size of the PD element 62, and associated increase in number of pixels or array elements will reduce the angle-estimation error, as shown in the graphs 150 and 152, since the noise is reduced. For example, consider an AOA sensor with a 25 MHz noise-bandwidth limiting filter. The detector array 60 should have at least 20 pixels on a side before the filter begins to be effective. If the array has progressively more elements than that number, the associated angle-estimation error would be progressively lower. Likewise, if the desired measurement bandwidth of the AOA sensor is only 10 MHz, an array that has 14 or more pixels on a side would benefit from the noise-bandwidth limiting filter 94.

The curves plotted in FIG. 9 show that as the illuminated-spot diameter is made progressively smaller than the optimal value for the spot diameter, the angle resolution again degrades. As the illuminated spot is made progressively smaller, more and more of the PD elements are not illuminated. However, the outputs of the digitization comparators 96 associated with those PD elements 62 may have a binary 1 value, even though those PD elements are not illuminated by the spot of laser light. PD elements have noise associated with effects such as dark current and TIAs also contribute noise. The comparator 96 also has noise. Such noise can cause the output of the comparator 96 to have a binary value of 1, resulting in a false detect.

In some embodiments, spatial filtering may be used to eliminate the "clutter noise" due to array elements that produce false detects (for which the digitization comparator 96 outputs a binary 1 value for a PD element 62 even though the illuminated spot of light 114 did not overlap that PD element 62 of the array 60). In one embodiment, a configuration of spatial filtering is provided that assumes that the illuminated spot of light 114 overlaps multiple adjacent PD elements 62 and such that those isolated elements that have a binary 1 value can be ignored.

Figure 12:
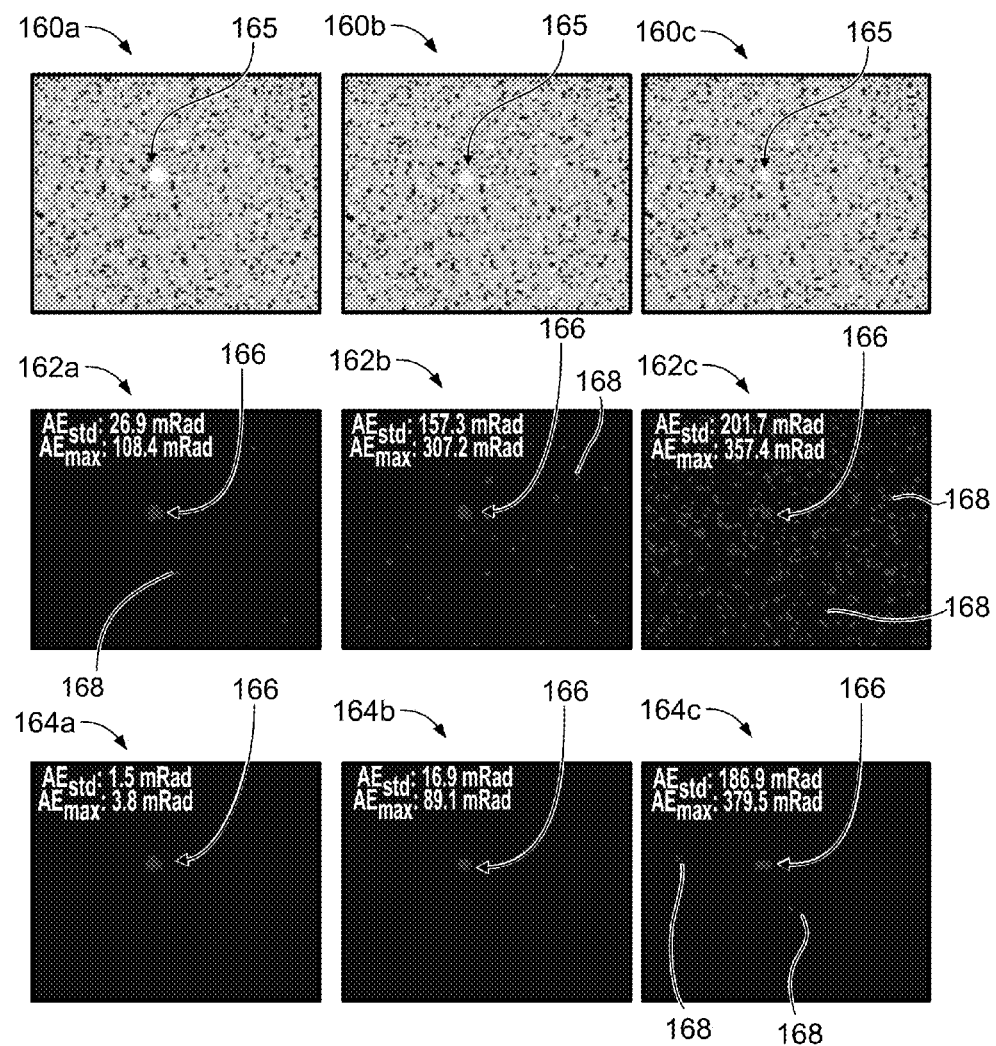
FIG. 12 are images illustrating the outputs of the detector channels of a detector array after several stages of signal processing in accordance with various embodiments.

The images 160, 162, and 164 of FIG. 12 illustrate the effect of the spatial filter, with the outputs for the pixels associated with PD elements 62 of the array provided from various circuits or modules of the interface circuits 90 and ISCD circuit 23 shown in 2D plots. The images 160a, 160b and 160c show the analog outputs from the noise bandwidth limiting filters 94 as a gray scale representation. These images depict examples with three different levels of intensity for the illuminated spot 165. The example with the strongest spot intensity (and highest total photocurrent) is depicted in FIG. 160a and the example with the weakest spot intensity is depicted in FIG. 160c. It should be noted that the images 160a, 160b and 160c illustrate the input to the digital comparator 96 (shown in FIG. 6). The images 162a, 162b and 162c illustrate the output of the digital comparator 96, for the cases of the images 160a, 160b and 160c, respectively. The images 164a, 164b and 164c illustrate the outputs from the spatial filters associated with the various pixels or PD array channels, namely the spatial filtering logic circuits 98 (shown in FIG. 6), for the cases of the images 160a, 160b and 160c, respectively the cases of the images 160a, 160b and 160c, respectively. Pixels that have a binary 1 value are shown as the spots 166 and 168.

For the three cases illustrated in FIG. 12, the digitization threshold set point is adjusted according to the level of the total photocurrent. As the threshold set point is lowered, more "dark" pixels 168 are observed. The spatial filter eliminates most of these "dark" pixels as can be seen in the images 164. The pixels that have a binary 1 value and that also are illuminated at least partially by the illuminated spot 165 are considered the "spot" pixels 166.

Figure 13:
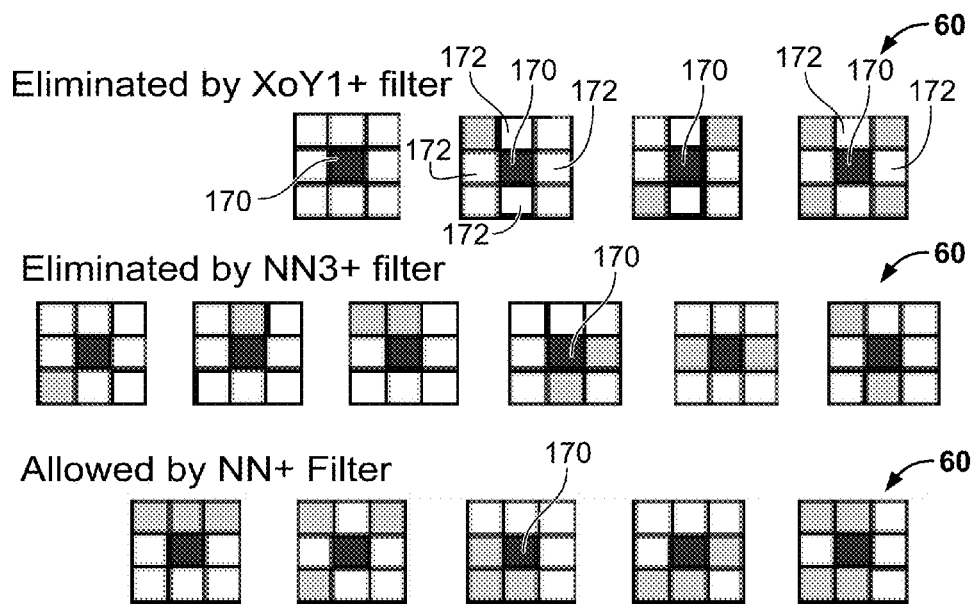
FIG. 13 illustrates different filtering techniques in accordance with various embodiments.

FIG. 13 illustrates examples of several different spatial filtering functions (showing a portion of the detector array 60). Each spatial filter considers a subset of the array elements to determine whether to allow the element 170 at the center of that subset of elements to retain a 1 value or to replace that 1 value by a 0 value. For example, the "XY" filters consider only the four nearest neighboring elements 172 that are adjacent to the sides of the square element 170 or pixel being evaluated, but not the nearest neighboring elements adjacent to the corners of that element 170. The X or Y 1+ (XoY1+) filter requires at least one of the side-adjacent pixels to also have a 1-value. The X and Y 2+ (XaY2+) filter requires at least one adjacent pixel along the x-axis and one adjacent pixel along the y-axis to have a 1-value. It should be apparent that another spatial filter could consider the four corner-adjacent pixels of an element 170 being evaluated. Another spatial filter that may be implemented by the spatial filtering logic circuits 98 in some embodiments is a "nearest neighbor" filter that considers all eight of the nearest neighboring pixels that surround a square pixel 170 being evaluated. The nearest neighbor 1+(NN1+) filter eliminates single isolated 1-value pixels that are fully surrounded by eight 0-value pixels. The nearest neighbor 2+(NN2+) filter eliminates single isolated 1-value pixels and also pairs of 1-value pixels. The nearest-neighbor 3+(NN3+) filter also eliminates these pixels and additionally eliminates all 1-value pixels that are not surrounded by at least 3 adjacent nearest-neighbor pixels that also have a 1 value. The nearest-neighbor pixels can be located on any side or corner of the pixel being evaluated.

Figure 14:
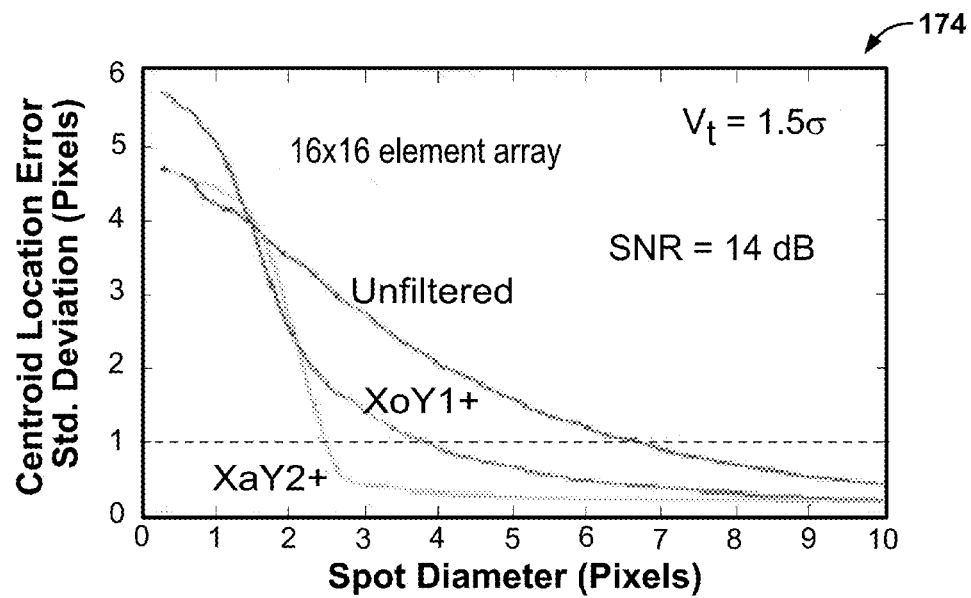
FIG. 14 is a graph of centroid location error.

In some embodiments, spatial filters, at times also used with varying digitization-threshold set point levels, may be used such as to enable sub-pixel centroid location accuracy to be achieved for smaller-diameter illuminated spots of light 114, as seen in the graph 174 of FIG. 14. For a smaller illuminated spot of light 114, the same SNR can be achieved for illuminated or partially illuminated pixels or PD elements 62 at a lower level of the total photo-current. Thus, as can be seen, the use of spatial filtering can improve the sensitivity of the AOA sensor.

Figure 15:
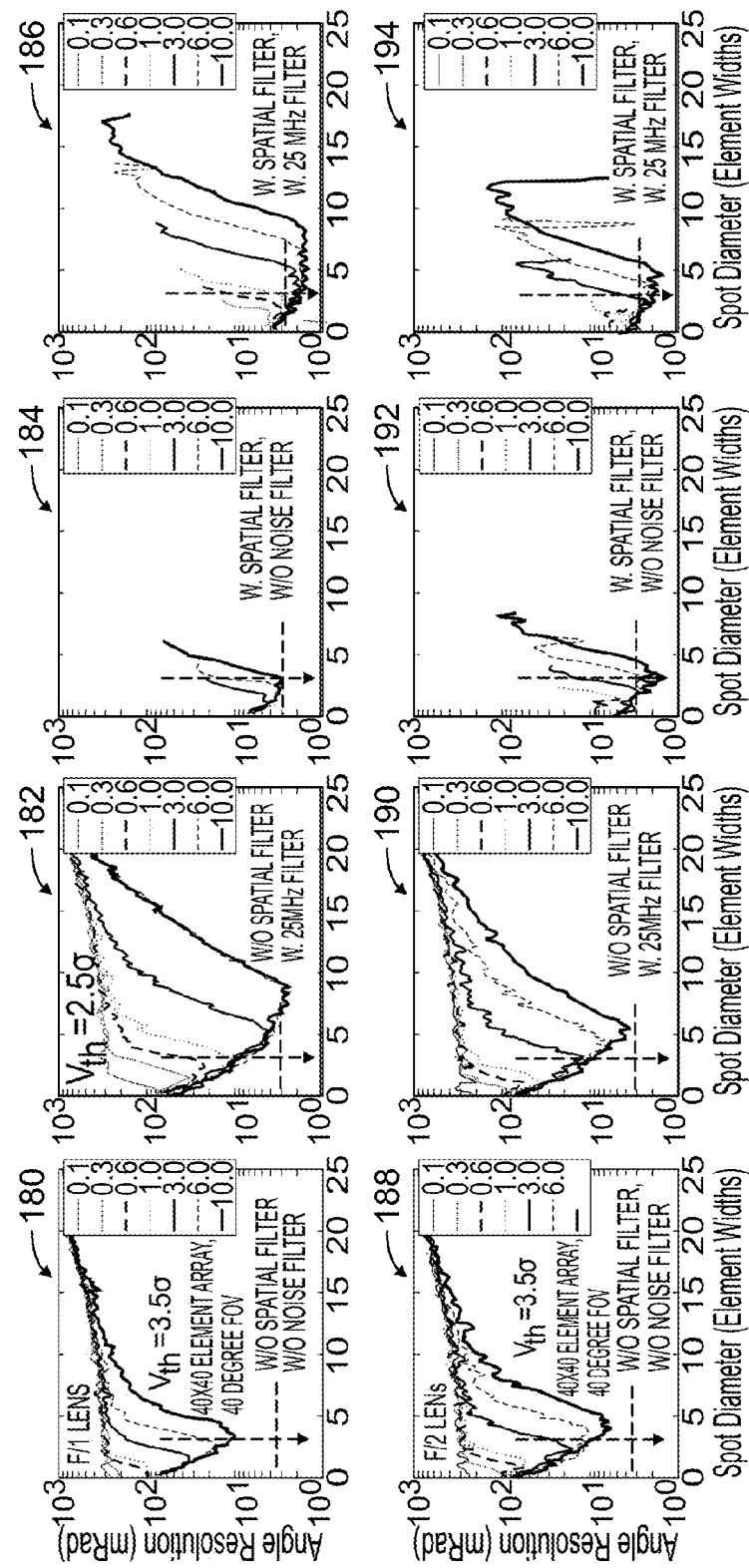
FIG. 15 are graphs illustrating AOA estimation resolution including with implementation of various embodiments.

In various embodiments, the combined effect of the noise-bandwidth limiting filter 94 and the spatial filter (embodied as the spatial filtering logic circuits 98) on the accuracy or resolution of the AOA determination is illustrated by the graphs 180, 182, 184, 186, 188, 190, 192, and 194 shown in FIG. 15. The simulation results shown in FIG. 15 include both the results from using an F/1 lens (the graphs 180, 182, 184, and 186) and the results from using an F/2 lens (the graphs 188, 190, 192, and 194). The graphs 180, 182, 184, 186, 188, 190, 192, and 194 are plotted for several values of the total photo-current (illustrated by the illustrated curves), from all of the PD elements 62 illuminated by the spot of light 114.

The graphs 180 and 188 show the angle resolution achieved when neither the noise-bandwidth limiting filters 94 nor the spatial filtering logic circuits 98 are used. As can be seen, the best accuracy is achieved for a spot diameter of approximately 6-8 element widths, for this example. It should be noted that the sensor with the F/2 lens achieves better resolution (smaller angle-estimation error) because the associated noise spectral density is integrated over a much smaller PD-limited bandwidth, although the value for that noise spectral density actually is higher (because those PD elements 62 are larger). When the noise-bandwidth limiting filters 94 are included, the angle-estimation error is reduced as shown in the graphs 182 and 190. It should be noted that the error reduction is more pronounced for the sensor with the F/1 lens (shown in the graph 182), because the associated PD-limited bandwidth is much greater than the 25 MHz bandwidth of the filter, and thus more noise is removed by that filter. It also should be noted that when the noise limiting filters 94 are included, a given value for low angle-estimation error can be achieved at lower levels of the total input photocurrent. Also, with the noise limiting filters added, the plotted curves are shifted to the right, toward large spot diameter values, and downward, with improved angle resolution.

When the spatial filtering logic circuits 98 are included (in the illustrated examples, the XorY1+ filter), the angle-estimation error is reduced as shown in the graphs 184 and 192 without shifting the plotted curves toward large spot diameter values. In the examples, the threshold set-point for the digitization comparator 96 was unchanged. When both the spatial filtering logic circuits 98 and the noise-bandwidth limiting filter 94 are included, sensitivity to lower photo-current levels also improves as can be seen in the graphs 186 and 194. It should be noted that the field of view and the number of PD elements 62 for each of the examples is the same (which essentially fixes the detector size and noise level). It should also be noted that the spatial filtering logic circuits 98 also make the AOA sensor unable to sense the lowest photo-current levels considered in these exemplary cases. For situations with those lowest photo-current levels, the digitization-threshold set point may be reduced to improve the angle estimation performance.

Figure 16:
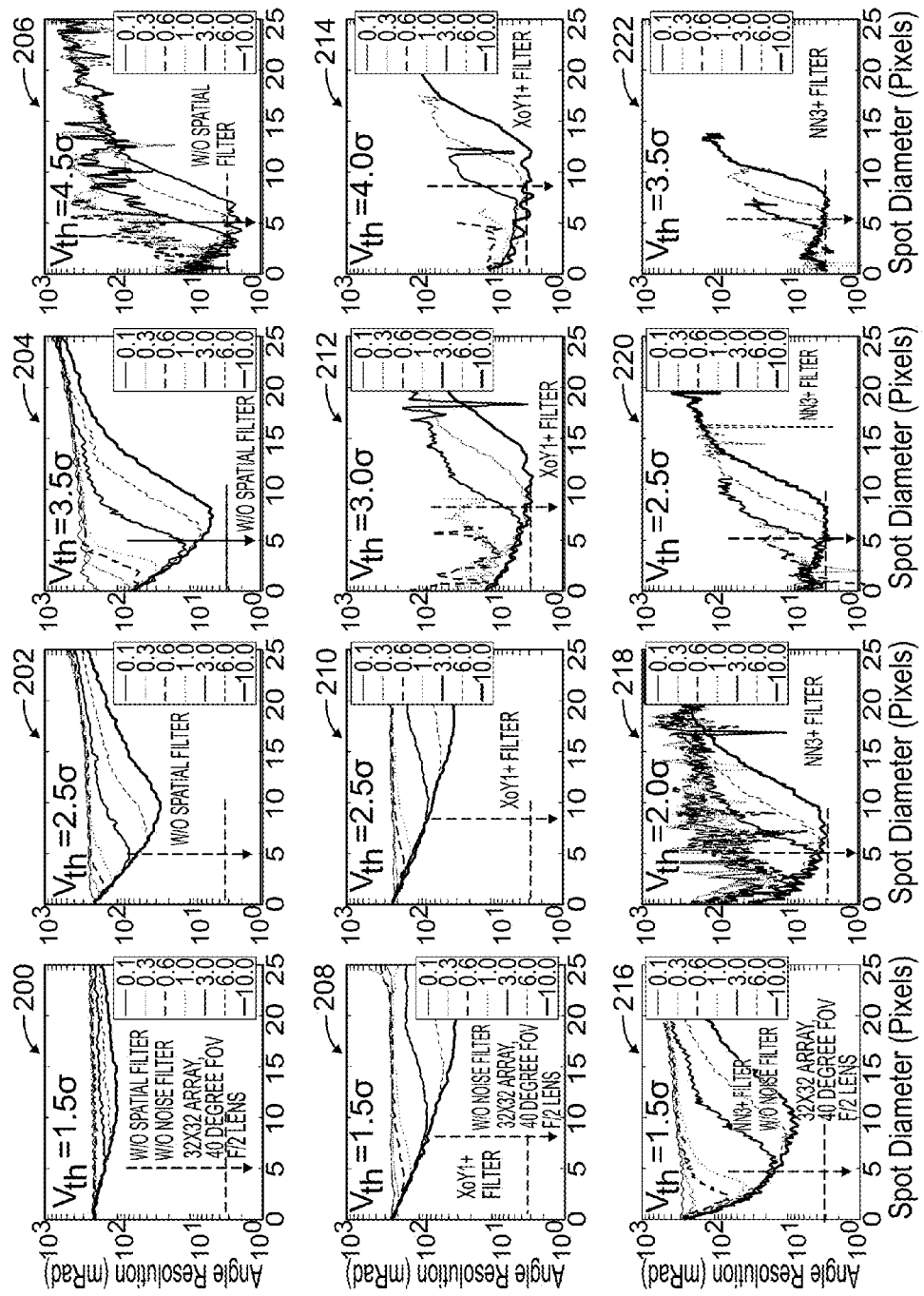
FIG. 16 are graphs illustrating AOA estimation resolution including with implementation of various embodiments.

FIG. 16 shows graphs 200, 202, 204, 206, 208, 210, 212, 214, 216, 218, 220, and 222 illustrating the effects of the spatial filtering and the digitization-threshold set point, for exemplary cases with a PD array of 32×32 elements, an F/2 lens and no noise filter. When spatial filtering is not used, the threshold set-point can be increased in order to ignore reduce the number of "dark" pixels that have a binary 1 value. The graphs 200, 202, 204, and 206 illustrate no spatial filtering and show that the angle-estimation error can be reduced by using a higher threshold set-point. However, a very high threshold set-point (e.g., graph 206) makes the AOA sensor not sensitive to the lower photo-current levels. It should be noted that the angle-resolution minima in the plots of the graphs 200, 202, 204, and 206 move to the left (toward smaller spot diameters) as the threshold set-point is raised, because spreading the incident light over a smaller spot increases the signal level at the illuminated PD elements 62, to enable the pixels associated with those elements 62 to still exceed the threshold setting. Use of spatial filtering in accordance with various embodiments allows the digitization threshold set-point to be lowered to accommodate lower values of the input signal from the photo-detected light, as illustrated by the exemplary simulation results shown in the graphs 208, 210, 212, and 214 illustrating weak spatial filtering, and in the graphs 216, 218, 220, and 22 illustrating when aggressive or strong spatial filtering is used. For example, when the digitization threshold set-point is low (e.g., graphs 208 and 216), the spatial filtering reduces the angle-estimation error and improves the angle resolution (e.g., in comparison to graph 200), with the more aggressive spatial filter (NN3+, as illustrated in graph 216) achieving lower angle-estimation error. Consider, for example, the cases of graphs 208, 210, 212 and 214. Initially, as the threshold set-point is raised, the angle-estimation error continues to be lowered for a sufficiently high combination of total photo-current and spot diameter (i.e., when the photo-current signal of the illuminated pixels is high enough). However, beyond a certain value for the threshold set-point, additional increase of the threshold does not result in further reduction of the angle-estimation error. Instead, those combinations of larger spot diameter and lower photo-current fail to give any reasonable angle estimation, and are no longer plotted. As shown by FIG. 16, when the spatial filtering is made more aggressive, e.g., by using the nearest-neighbor 3+ filter (shown in the graphs 216, 218, 220, and 222) instead of the X or Y1+ filter (shown in the graphs 208, 210, 212, and 214), the threshold set-point value at which a particular level of photo-current no longer gives a valid angle estimate becomes lower.

It should be noted that in various embodiments the configuration of the optical sensor 20 to provide AOA sensor capabilities includes selecting a preferred spot diameter and configuring the optical system to achieve that diameter of the projected illuminated spot. The spot size also determines the overall size of the detector array 60 to be used. The spatial filtering logic circuits 98 and the digitization threshold set-point are then selected to enable a desired total input photo-current value to be sensed. Then, the number of PD elements 62 per side of the array is selected to achieve a desired angle-estimation resolution. The number of PD elements 62, and thus the size of each PD element 62, affects the noise contributed by each array element. In some embodiments, to reduce that noise, the PD series resistance is reduced and/or lower-noise TIA designs are implemented. In some embodiments, increasing the photo-current signal for each array element includes using an avalanche PD that provides low-noise linear-mode avalanche carrier-multiplication gain. In some embodiments, the photo-current signal for each array element includes using an avalanche PD that provides non-linear Geiger mode gain. For some of those embodiments, a preamplifier 92, and even a noise-limiting filter 94, may not be needed after the PD element.

It should be noted that although the detector array 60 is illustrated as having square or rectangular shaped PD elements 62 that are located on a square or rectangular grid other shapes may be provided. For example, hexagons that lie on other grid patterns, such as a hexagonal close packed pattern, also could be used for the optical sensor 20. It should be noted that for an analog determination of the centroid, hexagonal detectors can achieve more linear estimation of the centroid location compared to a square grid of square detectors.

Thus, various embodiments provide an optical sensor 20 (and referring to FIG. 6) configured as a centroid-locating sensor having a plurality of photo-diode (PD) detector elements 62 arranged in an array with a plurality of preamplifiers (e.g., the TIAs 92) connected to the PD detector elements 62 such that the plurality of preamplifiers are configured to receive output signals from the PD detector elements 62. A plurality of digitization comparators 96 are also provided and are connected to the plurality of preamplifiers, wherein the digitization comparators 96 are configured in some embodiments to receive output signals from the plurality of electronic preamplifiers and generate a binary 1 output when the output from the preamplifier for a PD detector element 62 exceeds a threshold set point and generate a binary 0 output when the output is below the threshold set point. A plurality of spatial filtering logic circuits 98 are also connected to the digitization comparators 96 and configured to receive an output from the plurality of digitization comparators 96 corresponding to outputs from a plurality of the PD detector elements defining a group of PD detector elements. The plurality of spatial filtering logic circuits 98 are also configured to reject noise for one of the PD detector elements of the group of PD detector elements having a binary 1 output and based on the output of at least one other PD detector element of the group of PD detector elements.

Different filtering methods may be used to reject the noise as described herein. For example, in some embodiments the plurality of spatial filtering logic circuits 98 are configured to reject noise contributions associated with one or more of the PD detector elements 62 of the group of PD detector elements 62 with a binary 1 output and that do not have at least one adjacent PD detector element 62 with a binary 10 output. In other embodiments, when the output of the digitization comparator 96 for a PD detector element 62 is a binary 1, the plurality of spatial filtering logic circuits 98 replaces the binary 1 output with a binary 0 output for that PD detector element 62 when less than one of the digitization comparators 96 of the adjacent PD detector elements 62 have a binary 1 output. In other embodiments, when the output of the digitization comparator 96 for a PD detector element 62 is a binary 1, the plurality of spatial filtering logic circuits 98 replaces the binary 1 output with a binary 0 output for that PD detector element 62 when less than two of the digitization comparators 96 of the adjacent PD detector elements 62 have a binary 1 output. In other embodiments, when the output of the digitization comparator 96 for a PD detector element 62 is a binary 1, the plurality of spatial filtering logic circuits 98 replaces the binary 1 output with a binary 0 output for that PD detector element 62 when more than three of the digitization comparators 96 of the adjacent PD detector elements 62 along two orthogonal axes relative to the PD detector element 62 having the binary 1 output have a binary 0 output. In other embodiments, when the output of the digitization comparator 96 for a PD detector element 62 is a binary 1, the plurality of spatial filtering logic circuits 98 replaces the binary 1 output with a binary 0 output for that PD detector element 62 when less than two of the digitization comparators 96 of the adjacent PD detector elements 62 along two orthogonal axes relative to the PD detector element 62 having the binary 1 output also have a binary 1 output. In other embodiments, when the output of the digitization comparator 96 for a PD detector element 62 is a binary 1, the plurality of spatial filtering logic circuits 98 replaces the binary 1 output with a binary 0 output for that PD detector elements 62 when less than one of the digitization comparators 96 of the adjacent PD detector elements 62 along each of two orthogonal axes relative to the PD detector element 62 having the binary 1 output also have a binary 1 output.

In operation, the centroid location determining logic circuit or module 100 in some embodiments is configured to generate a pair of binary outputs, wherein a first binary output of the pair of binary outputs provides an X-location of the spot of light 114 projected on the PD array and a second binary output of the pair of binary outputs provides a Y-location of the spot of light projected on the PD array. In one embodiment, the X-location output and the Y-location output are outputs at a determined time for the same spot of light 114 projected on the PD array at another determined time. In one embodiment, the X-location and the Y-location are updated at a rate that is at least two times as large as a characteristic filtering bandwidth and/or at least two times as large as a characteristic response bandwidth of the PD detector element.

In some embodiments, a signal path between each of the PD detector elements 62 and an output of the centroid location determining logic circuit 100 is provided having a latency time interval, wherein the latency time interval of the signal paths for the PD detector elements 62 are matched to within one half the inverse of a characteristic filtering bandwidth.

In some embodiments, the optical sensor 20 includes the noise-bandwidth limiting filters 94, with a noise-bandwidth limiting filter 94 associated with each of the PD detector elements 62. In operation, each PD detector element 62 has a characteristic response bandwidth and the noise-bandwidth limiting filter 94 associated with the PD detector element 62 has one of a low-pass or band-pass filtering response with a characteristic filtering bandwidth, wherein the characteristic filtering bandwidth is smaller than the characteristic response bandwidth of the PD detector element 62. In some embodiments, the optical sensor 20 also includes the optical imaging system 34 configured to project a spot of light onto the PD detector elements 62, wherein the spot of light has a lateral dimension that is between two times and ten times as large as a lateral dimension of the PD element 62 (in some embodiments between three times and five times).

The plurality of PD detector elements 62 may have different shapes and configurations, such as a square shape and arranged in a square grid configuration, or a square shape and arranged in an offset grid configuration, or a hexagonal shape and arranged in a hexagonal packed configuration, for example.

The optical sensor 20 in some embodiments includes the centroid location determining logic circuit 100 coupled to the plurality of spatial filtering logic circuits 98, wherein the spatial filtering logic circuits 98 are configured to determine a location of a centroid of the spot of light 114 projected onto the PD array. In various embodiments, the centroid location determining logic circuit 100 may include a binary adder 101 and a binary divider 103 Additionally, the array element location weights component 102 may be provided and connected to the centroid location determining logic circuit 100, such that the array element location weights component 102 is configured to generate a different binary weight value for each PD element 62. For example, the binary adder 101 may be configured to add a binary weight value to the same binary weight value. In some embodiments, the binary adder 101 has a first input and a second input, wherein the first input is coupled to the output of a first binary adder and the second input is coupled to the output of a second binary adder. In some embodiments, a binary counter, such as the counter 106 may be provided.

As other examples, the centroid location determining logic circuit 100 may include the binary adder 101 and the binary divider 103, wherein the binary divider 103 has a numerator input and a denominator input, such that the binary adder 101 is coupled to the numerator input and the binary counter 106 is coupled to the denominator input.

The PD detector elements 62 also may include the absorber layer 82 and the conductor layer 84, wherein the conductor layer 84 is formed from a material with a bandgap that is larger than a direct-bandgap of a material comprising the absorber layer 82.

Additionally, as described herein, the optical sensor 20 may be configured as an AOA sensor.

It should be noted that the various embodiments may be implemented in hardware, software or a combination thereof. The various embodiments and/or components, for example, the modules, or components and controllers therein, also may be implemented as part of one or more computers or processors or field-programmable gate arrays (FPGA). The computer or processor or FPGA may include a computing device, an input device, a display unit and an interface, for example, for accessing the Internet. The computer or processor may include a microprocessor. The microprocessor may be connected to a communication bus. The computer or processor or FPGA may also include a memory. The memory may include Random Access Memory (RAM) and Read Only Memory (ROM). The computer or processor or FPGA further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer."

As used herein, the terms "system," "circuit," "component" or "module" may include a hardware and/or software system that operates to perform one or more functions. For example, a module, circuit, component or system may include a computer processor, controller, or other logic-based device that performs operations based on instructions stored on a tangible and non-transitory computer readable storage medium, such as a computer memory. Alternatively, a module, circuit, component or system may include a hard-wired device that performs operations based on hard-wired logic of the device. The modules or circuits or components shown in the attached figures may represent the hardware that operates based on software or hardwired instructions, the software that directs hardware to perform the operations, or a combination thereof.

The block diagrams of embodiments herein illustrate various blocks labeled "circuit" or "module." It is to be understood that the circuit or modules represent functions that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hard wired to perform the functions described herein. Optionally, the hardware may include electronic circuits that include and/or are connected to one or more logic-based devices, such as microprocessors, processors, controllers, or the like. Optionally, the modules may represent processing circuitry such as one or more field programmable gate array (FPGA), application specific integrated circuit (ASIC), or microprocessor. The circuit modules in various embodiments may be configured to execute one or more algorithms to perform functions described herein. The one or more algorithms may include aspects of embodiments disclosed herein, whether or not expressly identified in a flowchart or a method.

The computer or processor or component may execute a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A centroid-locating sensor comprising:
a plurality of photo-diode (PD) detector elements arranged in an array;
a plurality of digitization comparators connected to the plurality of PD detector elements, the digitization comparators configured to receive output signals from the plurality of PD detector elements and generate a binary 1 output when the output from at least one of the PD detector elements exceeds a threshold set point and generate a binary 0 output when the output is below the threshold set point; and
a plurality of spatial filtering logic circuits connected to the digitization comparators, the plurality of spatial filtering logic circuits configured to receive an output from the plurality of digitization comparators, wherein each of the plurality of spatial filtering logic circuits is configured to receive outputs from a plurality of the PD detector elements defining a group of PD detector elements, the plurality of spatial filtering logic circuits configured to reject noise for one of the PD detector elements of the group of PD detector elements having a binary 1 output based on the output of at least one other PD detector element of the group of PD detector elements.

2. The centroid-locating sensor of claim 1, wherein the plurality of spatial filtering logic circuits are configured to reject noise contributions associated with one or more of the PD detector elements of the group of PD detector elements with a binary 1 output and that have one adjacent PD detector element with a binary 0 output.

3. The centroid-locating sensor of claim 1, wherein when the output of the digitization comparator for a PD detector element is a binary 1, the plurality of spatial filtering logic circuits replaces a binary 1 output with a binary 0 output for the PD detector elements adjacent the PD detector element having the binary 1 output when less than one of the digitization comparators of the adjacent PD detector elements have a binary 1 output.

4. The centroid-locating sensor of claim 1, wherein when the output of the digitization comparator for a PD detector element is a binary 1, the plurality of spatial filtering logic circuits replaces a binary 1 output with a binary 0 output for the PD detector elements adjacent the PD element having the binary 1 output when less than three of the digitization comparators of the adjacent PD detector elements along two orthogonal axes relative to the PD detector element having the binary 1 output have a binary 0 output.

5. The centroid-locating sensor of claim 1, wherein when the output of the digitization comparator for a PD detector element is a binary 1, the plurality of spatial filtering logic circuits replaces a binary 1 output with a binary 0 output for the PD detector elements adjacent the PD detector element having the binary 1 output when less than one of the digitization comparators of the adjacent PD detector elements along each of two orthogonal axes relative to the PD detector element having the binary 1 output also have a binary 1 output.

6. The centroid-locating sensor of claim 1, further comprising a plurality of noise-bandwidth limiting filters, with a noise-bandwidth limiting filter associated with each of the PD detector elements.

7. The centroid-locating sensor of claim 6, further comprising a plurality of preamplifiers connection to the plurality of PD detector elements and wherein each combination of PD detector element and preamplifier has a characteristic response bandwidth and the noise-bandwidth limiting filter associated with the PD detector element has one of a low-pass or band-pass filtering response with a characteristic filtering bandwidth, wherein the characteristic filtering bandwidth is smaller than the characteristic response bandwidth of the PD detector element.

8. The centroid-locating sensor of claim 1, further comprising an optical imaging system configured to project a spot of light onto the PD detector elements, the spot of light having a lateral dimension that is between two times and ten times as large as a lateral dimension of the PD detector element.

9. The centroid-locating sensor of claim 8, wherein the optical imaging system comprises an aperture configured to receive light.

10. The centroid-locating sensor of claim 8, wherein the optical imaging system further comprises an optical diffuser.

11. The centroid-locating sensor of claim 1, wherein one or more PDs of the plurality of PD detector elements have a square shape and are arranged in a square grid configuration.

12. The centroid-locating sensor of claim 1, wherein one or more PDs of the plurality of PD detector elements have a square shape and are arranged in an offset grid configuration.

13. The centroid-locating sensor of claim 1, wherein one or more PDs of the plurality of PD detector elements have a hexagonal shape and are arranged in a hexagonal packed configuration.

14. The centroid-locating sensor of claim 1, further comprising a centroid location determining logic circuit coupled to the plurality of spatial filtering logic circuits, the centroid location determining logic circuits configured to determine a location of a centroid of a spot of light projected onto the PD detector elements.

15. The centroid-locating sensor of claim 14, wherein the centroid location determining logic circuit comprises a binary adder and a binary divider.

16. The centroid-locating sensor of claim 15, further comprising an array element location weights component connected to the centroid location determining logic circuit, the array element location weights component configured to generate a binary weight value for a corresponding row or column of PD detector elements.

17. The centroid-locating sensor of claim 16, wherein the binary adder is configured to add a binary weight value to the same binary weight value.

18. The centroid-locating sensor of claim 14, wherein the centroid location determining logic circuit comprises a binary adder having a first input and a second input, wherein the first input is coupled to the output of a first binary adder and the second input is coupled to the output of a second binary adder.

19. The centroid-locating sensor of claim 14, wherein the centroid location determining logic circuit comprises a binary counter.

20. The centroid-locating sensor of claim 19, wherein the centroid location determining logic circuit comprises a binary adder and a binary divider, the binary divider having a numerator input and a denominator input, wherein the binary adder is coupled to the numerator input and the binary counter is coupled to the denominator input.

21. The centroid-locating sensor of claim 1, wherein the PD detector elements comprise an absorber layer formed from a direct-bandgap semiconductor material including at least one of GaAs, InGaAs, InAsSb, InAs, InSb and HgCdTe.

22. The centroid-locating sensor of claim 1, wherein the PD detector elements comprise an avalanche carrier-multiplication structure.

23. The centroid-locating sensor of claim 1, wherein the PD detector elements comprise an absorber layer and a conductor layer, wherein the conductor layer comprises a material with a bandgap that is larger than a direct-bandgap of a material comprising the absorber layer.

24. The centroid-locating sensor of claim 1, further comprising a centroid location determining logic circuit coupled to the plurality of spatial filtering logic circuits, the spatial filtering logic circuits configured to generate a pair of binary outputs, wherein a first binary output of the pair of binary outputs provides an X-location of a spot of light projected on the PD detector elements and a second binary output of the pair of binary outputs provides a Y-location of the spot of light projected on the PD detector elements.

25. The centroid-locating sensor of claim 24, wherein the X-location output and the Y-location output comprise outputs at a determined time for the same spot of light projected on the PD detector elements at another determined time.

26. The centroid-locating sensor of claim 24, wherein the X-location and the Y-location are updated at a rate that is at least two times as large as a characteristic filtering bandwidth.

27. The centroid-locating sensor of claim 24, wherein the X-location and the Y-location are updated at a rate that is at least two times as large as a characteristic response bandwidth of the PD detector element.

28. The centroid-locating sensor of claim 1, further comprising a centroid location determining logic circuit coupled to the plurality of spatial filtering logic circuits and a signal path between each of the PD detector elements and an output of the centroid location determining logic circuit, with the signal path having a latency time interval, wherein the latency time interval of the signal paths for the PD detector elements are matched to within one half the inverse of a characteristic filtering bandwidth.

29. An angle-of-arrival determining sensor comprising:

a plurality of photo-diode (PD) detector elements arranged in an array;

a plurality of digitization comparators coupled to outputs of the plurality of PD detector elements, the digitization comparators configured to generate a binary 1 output when an output from a preamplifier for a PD detector element of the plurality of PD detector elements exceeds a threshold set point and generate a binary 0 output when the output from the PD detector element is below the threshold set point; and an optical system configured to project a spot of light onto at least some of the PD detector elements, with the spot of light having a lateral dimension that is between two times and ten times as large as a lateral dimension of a PD element of plurality of PD elements.

30. The angle-of-arrival determining sensor of claim 29, wherein a lateral dimension of the spot of light is between three times and five times as large as the lateral dimension of the PD detector element.

31. The angle-of-arrival determining sensor of claim 29, wherein the optical imaging system comprises an aperture and an optical diffuser.

32. The angle-of-arrival determining sensor of claim 29, further comprising a spatial filtering logic circuit connected with each of the plurality of PD detector elements.

33. The angle-of-arrival determining sensor of claim 29, further comprising a centroid location determining logic circuit having a pair of binary outputs, wherein a first binary output of the pair of binary outputs provides an X-location of the spot of light projected onto at least some of the PD detector elements and a second binary output of the pair of binary outputs provides a Y-location of the spot of light projected onto at least some of the PD detector elements.

34. The angle-of-arrival determining sensor of claim 29, wherein each of the PD detector elements comprises an absorber layer comprising a direct-bandgap semiconductor material and an avalanche carrier-multiplication structure.

35. The angle-of-arrival determining sensor of claim 34, wherein the avalanche carrier-multiplication structure is configured to provide a linear multiplication gain.

* * * * *